(12) United States Patent
Nawaz et al.

(10) Patent No.: US 11,825,266 B2
(45) Date of Patent: Nov. 21, 2023

(54) DIELECTRIC COMB FOR MEMS DEVICE

(71) Applicant: Knowles Electronics, LLC, Itasca, IL (US)

(72) Inventors: Mohsin Nawaz, Itasca, IL (US); Shubham Shubham, Itasca, IL (US); David Schafer, Itasca, IL (US); Michael Pedersen, Itasca, IL (US); Claus Furst, Roskilde (DK); Mohammad Shajaan, Værløse (DK); Jay Cech, Itasca, IL (US)

(73) Assignee: Knowles Electronics, LLC, Itasca, NY (US)

( * ) Notice: Subject to any disclaimer, the term of this patent is extended or adjusted under 35 U.S.C. 154(b) by 472 days.

(21) Appl. No.: 16/982,497

(22) PCT Filed: Mar. 20, 2019

(86) PCT No.: PCT/US2019/023260
§ 371 (c)(1),
(2) Date: Sep. 18, 2020

(87) PCT Pub. No.: WO2019/183283
PCT Pub. Date: Sep. 26, 2019

(65) Prior Publication Data
US 2021/0029470 A1 Jan. 28, 2021

Related U.S. Application Data

(60) Provisional application No. 62/646,003, filed on Mar. 21, 2018.

(51) Int. Cl.
*H04R 19/04* (2006.01)
*B81B 7/02* (2006.01)
(Continued)

(52) U.S. Cl.
CPC ............... *H04R 19/04* (2013.01); *B81B 7/02* (2013.01); *B81C 1/00341* (2013.01);
(Continued)

(58) Field of Classification Search
CPC .. H04R 19/04; H04R 31/00; H04R 2201/003; H04R 19/005; B81B 7/02;
(Continued)

(56) References Cited

U.S. PATENT DOCUMENTS 7,190,038 B2  3/2007 Dehe et al.
7,473,572 B2  1/2009 Dehe et al.
(Continued)

FOREIGN PATENT DOCUMENTS

CN  103379410 A  10/2013
CN  104902400 A   9/2015
(Continued)

OTHER PUBLICATIONS

First Office Action on CN Appl. Ser. No. 201980029967.3 dated Jul. 5, 2021 (10 pages).
(Continued)

*Primary Examiner* — Sunita Joshi
(74) *Attorney, Agent, or Firm* — FOLEY & LARDNER LLP

(57) ABSTRACT

Microphones including a housing defining a cavity, a plurality of conductors positioned within the cavity, at least one dielectric bar positioned within the cavity, and a transducer diaphragm. The conductors are structured to move in response to pressure changes while the housing remains fixed. A first conductor generates first electrical signals responsive to the pressure changes resulting from changes in an atmospheric pressure. A second conductor generates second electrical signals responsive to the pressure changes resulting from acoustic activity. The dielectric bar is fixed
(Continued)

with respect to the cavity and remains fixed under the pressure changes. The dielectric bar is adjacent to at least one of the conductors. In response to an applied pressure that is an atmospheric pressure and/or an acoustic pressure, the transducer diaphragm exerts a force on the housing and displaces at least a portion of conductors with respect to the dielectric bar.

15 Claims, 28 Drawing Sheets

(51) Int. Cl.
  *H04R 31/00* (2006.01)
  *B81C 1/00* (2006.01)
  *G01L 9/00* (2006.01)
  *G01L 19/14* (2006.01)

(52) U.S. Cl.
  CPC ............ *G01L 9/0072* (2013.01); *G01L 19/14* (2013.01); *H04R 31/00* (2013.01); *B81B 2201/0257* (2013.01); *B81B 2201/0264* (2013.01); *B81B 2203/0127* (2013.01); *B81B 2203/0136* (2013.01); *B81B 2207/03* (2013.01); *B81C 2201/0109* (2013.01); *B81C 2201/0132* (2013.01); *H04R 2201/003* (2013.01)

(58) Field of Classification Search
  CPC .... B81B 2201/0257; B81B 2201/0264; B81B 2203/0127; B81B 2203/0136; B81B 2207/03; B81C 1/00341; B81C 2201/0109; B81C 2201/0132; G01L 9/0072; G01L 19/14; G01L 23/125
  See application file for complete search history.

(56) References Cited

U.S. PATENT DOCUMENTS

| | | |
|---|---|---|
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,889,030 B2 | 2/2011 | Schoen et al. |
| 7,903,831 B2 | 3/2011 | Song |
| 8,040,207 B2 | 10/2011 | Winkler et al. |
| 8,115,573 B2 | 2/2012 | Schoen et al. |
| 8,461,655 B2 | 6/2013 | Klein et al. |
| 9,131,319 B2 | 9/2015 | Zoellin et al. |
| 9,503,814 B2 | 11/2016 | Schultz et al. |
| 9,641,137 B2 | 5/2017 | Duenser et al. |
| 9,728,653 B2 | 8/2017 | Dehe et al. |
| 10,153,740 B2 | 12/2018 | Albers et al. |
| 10,362,408 B2 | 7/2019 | Kuntzman et al. |
| 10,405,106 B2 | 9/2019 | Lee |
| 2005/0207605 A1 | 9/2005 | Dehe et al. |
| 2007/0210392 A1 | 9/2007 | Sakakibara et al. |
| 2007/0278501 A1 | 12/2007 | MacPherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2013/0255069 A1 | 10/2013 | Higashi et al. |
| 2013/0279717 A1 | 10/2013 | Reimann et al. |
| 2015/0110291 A1 | 4/2015 | Furst et al. |
| 2015/0158722 A1 | 6/2015 | Lim et al. |
| 2015/0256913 A1* | 9/2015 | Dehe ...................... H04R 19/04 381/176 |
| 2016/0066099 A1 | 3/2016 | Dehe et al. |
| 2017/0297895 A1 | 10/2017 | Kautzsch et al. |
| 2018/0317022 A1 | 11/2018 | Evans et al. |
| 2020/0112799 A1 | 4/2020 | Kuntzman et al. |
| 2020/0252728 A1 | 8/2020 | Niederberger |
| 2020/0252729 A1 | 8/2020 | Mueller et al. |
| 2021/0029470 A1 | 1/2021 | Nawaz et al. |

FOREIGN PATENT DOCUMENTS

| | | |
|---|---|---|
| CN | 106976836 | 7/2017 |
| JP | S63-108235 | 5/1988 |
| WO | WO-2013/092706 | 6/2013 |

OTHER PUBLICATIONS

U.S. Appl. No. 17/037,959, filed Sep. 30, 2020, Naderyan, Vahid; Pedersen, Michael; Loeppert, Peter.
U.S. Appl. No. 17/111,465, filed Dec. 3, 2020, Loeppert, Peter; Pedersen, Michael.
U.S. Appl. No. 17/117,073, filed Dec. 9, 2020, Nawaz, Mohsin; Thompson, Stephen C.; Pedersen, Michael; Loeppert, Peter; Sbiaa, Zouhair.
U.S. Appl. No. 17/127,794, filed Dec. 18, 2020, Chandrasekaran, Venkataraman; Kuntzman, Michael; Pedersen, Michael; Lee, Sung B.
U.S. Appl. No. 17/133,506, filed Dec. 23, 2020, Loeppert, Peter; Pedersen, Michael.
U.S. Appl. No. 17/137,678, filed Dec. 30, 2020, Guo, Jim.
U.S. Appl. No. 17/286,231, filed Apr. 16, 2021, Loeppert, Peter; Pedersen, Michael.
Bay et al., "Design of a silicon microphone with a differential read-out of a sealed double parallel-plate capacitor", Sensors and Actuators A: Physical, Elsevier BV,NL, vol. 53, No. 1, May 1, 1996 (May 1, 1996), pp. 232-236, XP004018151, ISSN: 0924-4247, DOI: 10.1016/0924-4247 (96)01129-6.
International Preliminary Report on Patentability issued in corresponding International Application No. PCT/US2019/023260 dated Sep. 22, 2020.
Bay J et al: "Design of a Silicon Microphone with Differential Read-Out of a Sealed Double Parallel-Plat Capacitor," The 8th International Conference on Solid-State Sensors and Actuators, 1995, 4 pages.
International Search Report and Written Opinion received for PCT Application No. PCT/US2019/023260, Knowles Electronics, LLC, dated Sep. 25, 2019, 24 pages.
Chen et al., "MEMS gyroscope structure with low mechanical-thermal noise and weak mechanical coupling" Journal of Chinese Inertial Technology, vol. 23, No. 3, Jun. 2015, pp. 373-378, DOI:10. 13695/j.cnki.12-1222/03.2015.03.017.
Foreign Action other than Search Report on CN201980029967.3 dated Apr. 8, 2022 (11 pages).

\* cited by examiner

DIELECTRIC COMB FOR MEMS DEVICE

CROSS-REFERENCE TO RELATED PATENT APPLICATION

This application is a National Stage Application of PCT/US2019/023260, filed Mar. 20, 2019, which claims the benefit of U.S. Provisional Patent Application No. 62/646,003 filed Mar. 21, 2018, the disclosure of which are incorporated herein by reference in their entirety.

BACKGROUND

Microphones are deployed in various types of devices such as personal computers, cellular phones, mobile devices, headsets, headphones, and hearing aid devices. However, as the devices get smaller, they require smaller microphones. Smaller microphones often experience greater signal loss due to friction and often have lower signal-to-noise ratios than larger microphones.

SUMMARY

One implementation relates to a microphone including a dielectric comb and a control circuit. The dielectric comb includes a housing defining a cavity, a plurality of conductors positioned within the cavity, and at least one dielectric bar positioned within the cavity. The plurality of conductors are structured to move in response to pressure changes while the housing remains fixed. The pressure changes include pressure changes resulting from acoustic activity and pressure changes resulting from changes in an atmospheric pressure. The plurality of conductors includes at least one first conductor and at least one second conductor. The at least one first conductor is configured to generate first electrical signals responsive to the pressure changes resulting from changes in the atmospheric pressure. The at least one second conductor is configured to generate second electrical signals responsive to the pressure changes resulting from the acoustic activity. The at least one dielectric bar positioned within the cavity and secured in a fixed position with respect to the cavity such that the at least one dielectric bar remains fixed under the pressure changes. Each of the at least one dielectric bars is adjacent to at least the at least one first conductor or at least one second conductor of the plurality of conductors. The control circuit includes an atmospheric pressure processing circuit and an acoustic activity processing circuit. The atmospheric pressure processing circuit is electrically coupled to the at least one first conductor and configured to receive the first electrical signals and generate an atmospheric pressure signal indicative of the pressure changes resulting from the changes in atmospheric pressure. The acoustic activity processing circuit is electrically coupled to the at least one second conductor and configured to receive the second electrical signals and generate an acoustic signal indicative of the pressure changes resulting from the acoustic activity.

In some implementations, the microphone further includes at least one isolator coupled to the housing and movable with respect to the housing in response to pressure changes. The plurality of conductors are coupled to the at least one isolator.

In some implementations, the control circuit further includes a charge pump electrically connected to at least a portion of the plurality of conductors to provide a biasing charge to at least the portion of the plurality of conductors. The atmospheric pressure processing circuit is configured to process the first electrical signals to generate a charge pump bias signal in response to the pressure changes resulting from the changes in the atmospheric pressure.

In some implementations, the charge pump bias signal is configured to generate an electric force between the plurality of conductors to move the plurality of conductors in a direction opposite a direction of movement caused by the changes in the atmospheric pressure.

In some implementations, the electric force is configured to return the plurality of conductors to a rest position at which the plurality of conductors would be positioned in the absence of the pressure changes resulting from the changes in atmospheric pressure.

In some implementations, the microphone further includes a diaphragm that extends into the cavity and exerts a force on the dielectric comb. The pressure changes cause movement of the diaphragm. The changes in the movement of the diaphragm cause movement of the plurality of conductors relative to the plurality of dielectric bars.

In some implementations, the diaphragm includes a first bellow plate, a second bellow plate secured to the first bellow plate by a first compliant structure, and a third bellow plate secured to the second bellow plate by a second compliant structure. The first bellow plate and the second bellow plate are annular and the third bellow plate is circular.

In some implementations, the diaphragm includes a first layer formed of a first material having a first modulus of elasticity and a second layer formed of a second material having a second modulus of elasticity smaller than the first modulus of elasticity.

In some implementations, the cavity is a vacuum.

Another implementation relates to a microelectromechanical system (MEMS) transducer including a bellow diaphragm. The bellow diaphragm includes a first bellow plate, one or more second bellow plates, a third bellow plate, and a plurality of compliant structures. The first bellow plate is annular. The one or more second bellow plates are annular. The third bellow plate is circular. The plurality of compliant structures connect the first bellow plate, the one or more second bellow plates, and the third bellow plate. At a rest position, the first bellow plate, the one or more second bellow plates, and the third bellow plate are substantially parallel. In response to an applied pressure, the applied pressure being at least one of an atmospheric pressure and an acoustic pressure, the MEMS transducer extends to an extended position in which the first bellow plate and the one or more second bellow plates are slanted with respect to the third bellow plate.

In some implementations, the first position occurs in the absence of an external applied force.

In some implementations, the first bellow plate, the second bellow plate, and the third bellow plate are structured to move in response to changes in the applied pressure.

In some implementations, the plurality of compliant structures are configured to maintain compliance levels between 1 nm/Pa and 10 nm/Pa as the MEMS transducer undergoes cyclic loading.

In some implementations, the first bellow plate, the one or more second bellow plates, and the third bellow plate each have a thickness of substantially 0.5 μm through substantially 2 μm.

In some implementations, a spacing between adjacent ones of the first bellow plate, the one or more second bellow plates, and the third bellow plate is substantially 0.5 μm through 5 μm.

In some implementations, the one or more second bellow plates includes three second bellow plates.

In some implementations, the one or more second bellow plates includes five second bellow plates.

In some implementations, the one or more second bellow plates includes seven second bellow plates.

Another implementation relates to a microelectromechanical system (MEMS) transducer configured for use with a microphone system including a housing defining a cavity and a pressure sensor positioned within the cavity. The MEMS transducer includes a first layer and a second layer. The first layer includes a contact wall structured to exert a force on the pressure sensor. The first layer is formed of a first material having a first modulus of elasticity. The second layer is formed on the first layer. The second layer is formed of a second material having a second modulus of elasticity lower than the first modulus of elasticity. At least a portion of the first layer and the second layer are secured to the housing for deflection with respect to the housing. The second layer is structured to receive concentrated stress exerted by the housing on the MEMS transducer during deflection and transmit the concentrated stress to the first layer as a distributed stress.

In some implementations, the first layer has a thickness of 100 nm-1 μm to maintain a vacuum in the cavity.

In some implementations, the first modulus of elasticity is between 50 GPa and 200 GPa.

In some implementations, the second modulus of elasticity is between 1 GPa and 10 GPa.

Another implementation relates to a control circuit for a microelectromechanical system (MEMS) microphone. The control circuit includes an atmospheric pressure processing circuit and an acoustic activity processing circuit. The atmospheric pressure processing circuit is configured to receive a first signal from a first plurality of conductors of a movable sensing structure of the MEMS microphone that are generated in response to movement of the movable sensing structure and to process the first signal to generate a signal indicative of a change in an atmospheric pressure. The acoustic activity processing circuit is configured to receive a second signal from a second plurality of conductors of the movable sensing structure. The acoustic activity processing circuit is configured to process the second signal to generate a signal indicative of acoustic activity.

In some implementations, the control circuit further includes a charge pump connected to the movable sensing structure. The atmospheric pressure processing circuit is configured to control the charge pump to provide a bias signal to one or more of at least the first plurality of conductors of the movable sensing structure based on the signal indicative of the change in the atmospheric pressure.

In some implementations, the bias charge is sized to bias the movable sensing structure to compensate for the change in the atmospheric pressure.

In some implementations, the second signal has a high frequency portion and a low frequency portion. The acoustic activity processing circuit includes a filter configured to remove the low frequency portion of the second signal.

In some implementations, the second signal has an amplitude. The acoustic activity processing circuit includes a feedback circuit configured to determine the amplitude of the second signal. In response to the amplitude exceeding a predetermined threshold, the acoustic activity processing circuit is configured to generate a feedback signal to reduce the amplitude of the second signal to prevent overload of the acoustic activity processing circuit.

In some implementations, the second plurality of conductors is different from the first plurality of conductors.

Another implementation relates to a microphone including a housing defining a cavity, a plurality of conductors positioned within the cavity, at least one dielectric bar positioned within the cavity, and a transducer diaphragm. The plurality of conductors are structured to move in response to pressure changes while the housing remains fixed. The pressure changes include pressure changes resulting from acoustic activity and pressure changes resulting from changes in an atmospheric pressure. The plurality of conductors include at least one first conductor and at least one second conductor. The at least one first conductor is configured to generate first electrical signals responsive to the pressure changes resulting from changes in the atmospheric pressure. The at least one second conductor is configured to generate second electrical signals responsive to the pressure changes resulting from the acoustic activity. The at least one dielectric bar is positioned within the cavity and secured in a fixed position with respect to the cavity such that the at least one dielectric bar remains fixed under the pressure changes. Each of the at least one dielectric bars is adjacent to at least one of the conductors of the plurality of conductor. The transducer diaphragm includes a first bellow plate, one or more second bellow plates, a third bellow plate, and a plurality of compliant structures. The first bellow plate is annular. The one or more second bellow plates are annular. The third bellow plate is circular. The plurality of compliant structures connect the first bellow plate, the one or more second bellow plates, and the third bellow plate. At a rest position, the first bellow plate, the one or more second bellow plates, and the third bellow plate are substantially parallel. In response to an applied pressure, the applied pressure being at least one of an atmospheric pressure and an acoustic pressure, the MEMS transducer extends to an extended position in which the first bellow plate and the one or more second bellow plates are slanted with respect to the third bellow plate and the MEMS transducer exerts a force on the dielectric comb. The force displaces at least a portion of the plurality of conductors with respect to at least a portion of the dielectric bars.

Another embodiment relates to a microphone including a housing defining a cavity, a plurality of conductors positioned within the cavity, at least one dielectric bar positioned within the cavity, and a transducer. The plurality of conductors are structured to move in response to pressure changes while the housing remains fixed. The pressure changes include pressure changes resulting from acoustic activity and pressure changes resulting from changes in an atmospheric pressure. The plurality of conductors includes at least one first conductor and at least one second conductor. The at least one first conductor is configured to generate first electrical signals responsive to the pressure changes resulting from changes in the atmospheric pressure. The at least one second conductor is configured to generate second electrical signals responsive to the pressure changes resulting from the acoustic activity. The at least one dielectric bar is positioned within the cavity and secured in a fixed position with respect to the cavity such that the at least one dielectric bar remains fixed under the pressure changes. Each of the at least one dielectric bars is adjacent to at least one of the conductors of the plurality of conductors. The transducer includes a first layer and a second layer. The first layer includes a contact wall structured to exert a force on the pressure sensor. The first layer is formed of a first material having a first modulus of elasticity. The second layer is formed on the first layer. The second layer formed of a second material having a second modulus of elasticity lower than the first modulus of elasticity. At least a portion of the first layer and the second layer are secured to the housing for deflection with respect to the housing. The second layer is structured to receive a concentrated reaction force exerted by the housing on the MEMS transducer during deflection and transmit the concentrated stress to the first layer as a distributed stress. The first layer exerts a force on the dielectric comb. The force displaces at least a portion of the plurality of conductors with respect to at least a portion of the dielectric combs.

Another implementation relates to a method for manufacturing a microelectromechanical (MEMS) transducer. The method includes depositing a thermal oxide layer over a first surface of a substrate having opposed first and second surfaces. The method further includes depositing one or more doped oxide layers and one or more undoped oxide layers. The one or more doped oxide layers and the one or more undoped oxide layers are alternately spaced. One of the one or more doped oxide layers is adjacent the thermal oxide layer. The method further includes etching away a portion of the one or more doped oxide layers to expose the surfaces of the one or more undoped oxide layers. The method further includes depositing a diaphragm layer over the surfaces of the thermal oxide layer, the one or more doped oxide layers, and the one or more undoped oxide layers. The method further includes etching away a portion of the second surface of the substrate to expose the thermal oxide layer. The method further includes etching away the one or more doped oxide layers, the one or more undoped oxide layers, and a portion of the thermal oxide layer from the diaphragm layer. The diaphragm layer defines a diaphragm transducer secured to the first surface of the substrate by the thermal oxide layer and movable relative to the substrate.

In some implementations, the diaphragm layer is a polysilicon material or a silicon nitride material.

In some implementations, the diaphragm layer has a thickness of 0.5 μm to 2 μm.

In some implementations, the diaphragm layer is deposited using low pressure chemical vapor deposition.

In some implementations, the doped sacrificial oxide is phosphosilicate glass and the undoped sacrificial oxide is silicate glass.

Figure 1:
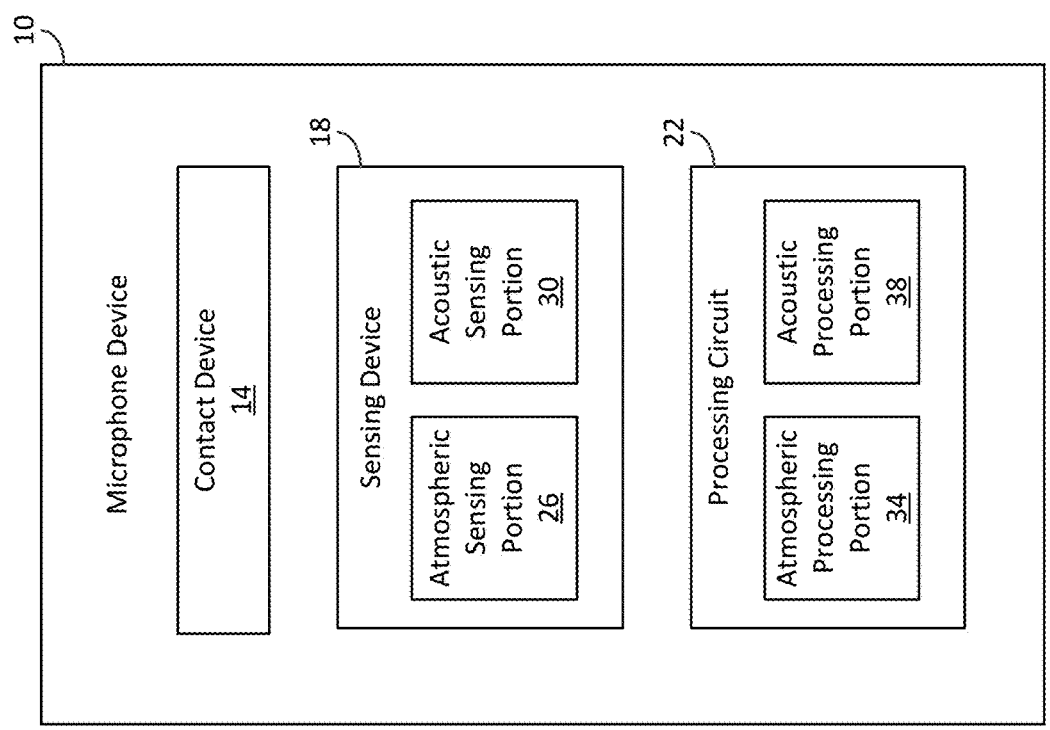
FIG. 1 is a schematic representation of a microphone system according to implementations of the present disclosure.

In the following detailed description, reference is made to the accompanying drawings, which form a part hereof. In the drawings, similar symbols typically identify similar components, unless context dictates otherwise. The illustrative implementations described in the detailed description, drawings, and claims are not meant to be limiting. Other implementations may be utilized, and other drawings may be made, without departing from the sprit or scope of the subject matter presented here. It will be readily understood that aspects of the present disclosure, as generally described herein, and illustrated in the figures can be arranged, substituted, combined, and designed in a wide variety of different configurations, all of which are explicitly contemplated and make part of this disclosure.

DETAILED DESCRIPTION

Performance losses in microelectromechanical systems (MEMS) microphones occur due to viscous losses from a back plate of a MEMS device. The adverse impact of viscous losses on microphone performance increases as microphone size decreases. The viscous losses of the back plate can be significantly reduced by encapsulating the MEMS device under low pressure or ideally vacuum conditions. However, encapsulation under low pressure or vacuum conditions makes the MEMS device more prone to responding to atmospheric pressure changes, which can generate noise in the acoustic signals and/or data sensed by the MEMS device. Atmospheric pressure at sea level is 100 kPa, which is about 3 orders of magnitude beyond the dynamic range of acoustic pressure (200 Pa). The present disclosure is related to counteracting measured fluctuations in the atmospheric pressure by generating a counteracting electrostatic force.

The present disclosure provides a dielectric comb for use with a MEMS transducer. The dielectric comb includes conductors that are positioned adjacent dielectric insulators. A portion of the conductors are adapted to sense acoustic activity and a portion of the conductors are adapted to sense atmospheric pressure. The atmospheric pressure signal sensed by certain portions of the conductor is used to generate a bias voltage using a charge pump to counteract the atmospheric pressure and reduce noise caused by fluctuations in the atmospheric pressure. The bias voltage causes an electrostatic force between adjacent conductors that counteracts the force caused by fluctuations in the atmospheric pressure.

The present disclosure also provides a bellow diaphragm for use with a MEMS transducer. The bellow diaphragm includes a plurality of plates that are connected by compliant structures that can elongate without becoming stiff. The bellow diaphragm is secured above the dielectric comb. The bellow diaphragm extends and retracts in response to the atmospheric pressure and in response to acoustic activity. The bellow diaphragm is configured so that forces exerted by acoustic activity cause the bellow diaphragm to extend far enough to exert a force on the dielectric comb.

The present disclosure also provides a layered diaphragm including a first layer and a second layer. The first layer is made from a relatively rigid material, such as a metal, and is relatively thin. The second layer is made from a relatively elastic material and is thicker than the first layer. The layered diaphragm is secured above the dielectric comb and extends and retracts in response to the atmospheric pressure and in response to acoustic activity. The first layer is sufficiently rigid to hold a vacuum in a cavity surrounding at least a portion of the dielectric comb. The second layer is structured to receive concentrated stresses generated by deflection of the layered diaphragm relative to the MEMS transducer and apply these stresses to the first layer as a distributed force. The first layer and the second layer are configured so that the layered diaphragm can undergo multiple cycles of extension and retraction without becoming stiff.

As shown in FIG. 1, one implementation relates to a microphone device 10 including a contact device 14, a sensing device 18, and a processing circuit 22. The contact device 14 is designed to make physical contact with the sensing device 18. The contact device 14 is designed to exert a force on the sensing device 18 under atmospheric pressure conditions. The atmospheric pressure varies based on altitude and changes in weather conditions. Accordingly, as used herein, the term "atmospheric pressure" refers to pressures ranging between 20 kPa (e.g. at the peak of Mount Everest) and 100 kPa (e.g., at sea level). The force exerted by the contact device 14 on the sensing device 18 changes in response to changes in pressure. The contact device 14 may be any type of device structured such that at least a portion of the contact device 14 moves in response to pressure changes and changes the force exerted on the sensing device 18. In some implementations, the contact device 14 is structured to deflect in response to a change in pressure, such that a portion of the contact device 14 contacts the sensing device 18 while another portion of the contact device 14 remains fixed. The changes in pressure may be a change in an ambient atmospheric pressure and/or a change in pressure caused by an acoustic pressure (e.g. a sound). The sensing device 18 is structured to move when contacted by the contact device 14 (e.g., in response to the force exerted by the contact device 14).

The sensing device 18 includes an atmospheric sensing portion 26 and an acoustic sensing portion 30. The atmospheric sensing portion 26 is structured to generate an electronic signal representative of deflection of the sensing device 18 occurring in response to a change in the atmospheric pressure. The acoustic sensing portion 30 is structured to generate an electronic signal representative of deflection occurring in response to a change in pressure due to a change in an acoustic pressure (e.g. due to an acoustic stimulus and/or an acoustic activity such as a sound). In some implementations, the sensing device 18 is positioned in a vacuum so that the sensing device 18 is isolated from movements not caused by the contact device 14.

The processing circuit 22 includes an atmospheric processing portion 34 and an acoustic processing portion 38. The processing circuit 22 is structured to receive the signal generated by the sensing device 18. In some implementations, the atmospheric sensing portion 26 of the sensing device 18 may be structured to send signals to the atmospheric processing portion 34, and the acoustic sensing portion 30 of the sensing device 18 may be structured to send signals to the acoustic processing portion 38. In such an implementation, the atmospheric sensing portion 26 may be coupled to the atmospheric processing portion 34 and the acoustic sensing portion 30 may be coupled to the acoustic processing portion 38. More specifically, the atmospheric sensing portion 26 may be hardwired to the atmospheric processing portion 34 using leads and traces to form an electrical connection between the atmospheric sensing portion 26 and the atmospheric processing portion 34. Similarly, the acoustic sensing portion 30 may be hardwired to the acoustic processing portion 38 using leads and traces to form an electrical connection between the acoustic sensing portion 30 and the acoustic processing portion 38. The processing circuit 22 processes the signal(s) to generate data and/or signals indicative of acoustic activity (i.e., acoustic signals and/or data) and data and/or signals indicative of the atmospheric pressure (i.e., atmospheric pressure signals and/or data). In some implementations, the atmospheric processing portion 34 may change a bias of the sensing device 18 based on the signal received from the sensing device 18. After the acoustic processing portion 38 has generated the acoustic signals and/or data, the acoustic signals and/or data may be stored in a memory (e.g., of the processing circuit and/or a memory device in wired or wireless communication with the acoustic processing portion 38). The acoustic signals and/or data may also be sent via a wireless or wired connection to a receiving device, such as a speaker. In some implementations, the acoustic signals and/or data may be corrected to compensate for non-linearity of the sensing device, variations that occurred during manufacturing, and/or temperature. In such implementations, compensation coefficients for use in the compensation may be stored in the memory.

Figure 2:
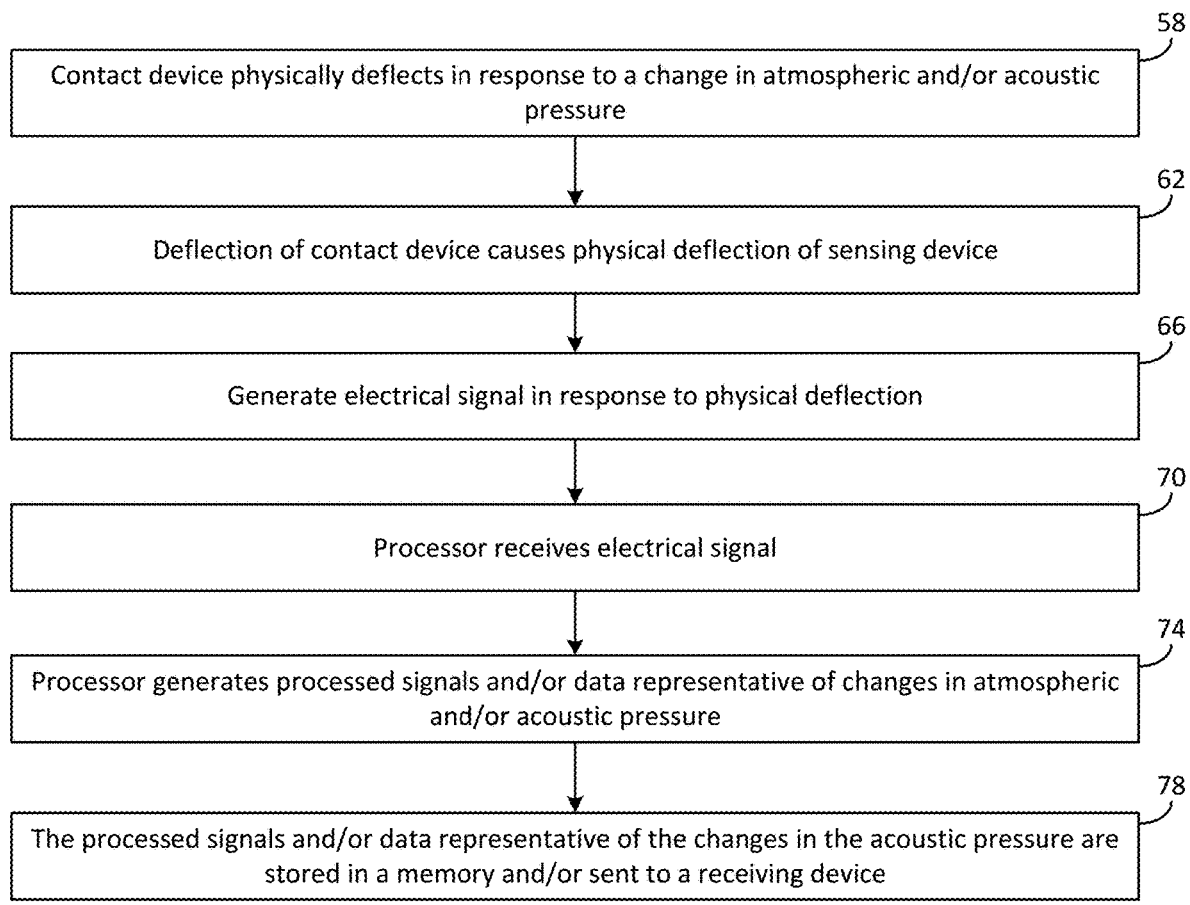
FIG. 2 is a flowchart illustrating the operation of the microphone system of FIG. 1 according to implementations of the present disclosure.

FIG. 2 depicts a flow chart illustrating the operation of the microphone device 10 according to an implementation of the present disclosure. The contact device 14 deflects in response to detecting a change in pressure (58). The deflection of the contact device 14 causes physical movement of the sensing device 18 (62). The atmospheric sensing portion 26 and/or the acoustic sensing portion 30 generate one or more electrical signals based on the physical movement of the sensing device 18 (66). The processing circuit 22 receives the electrical signal(s) from the sensing device 18 (70). In some implementations, the atmospheric sensing portion 26 and the acoustic sensing portion 30 each generate separate electrical signals indicative of the force exerted on the device (e.g., due to both the atmospheric pressure and the acoustic pressure). For example, the atmospheric sensing portion 26 is configured or structured to transmit electrical signals to the atmospheric processing portion 34 using the leads and traces that form the electrical connection between the atmospheric sensing portion 26 and the atmospheric processing portion 34. The atmospheric processing portion 34 is structured to remove the component of the electrical signal that is generated based on the acoustic pressure. Similarly, the acoustic sensing portion 30 is configured or structured to transmit signals to the acoustic processing portion 38 using the leads and traces that form the electrical connection between the acoustic sensing portion 30 and the acoustic processing portion 38. The acoustic processing portion 38 is structured to remove the component of the electrical signal that is generated based on the atmospheric pressure.

The processing circuit 22 generates processed signals and/or data representative of changes in the atmospheric pressure and changes in acoustic pressure as sensed by the sensing device 18 (74). In some implementations, the atmospheric processing portion 34 may change a bias of the sensing device 18 based on the signal received from the sensing device 18. After the acoustic processing portion 38 has generated the acoustic signals and/or data, the acoustic signals and/or data may be stored in a memory (e.g., of the processing circuit and/or a memory device in wired or wireless communication with the acoustic processing portion 38). The acoustic signals and/or data may also be sent via a wireless or wired connection to a receiving device, such as a speaker (78).

Figure 3:
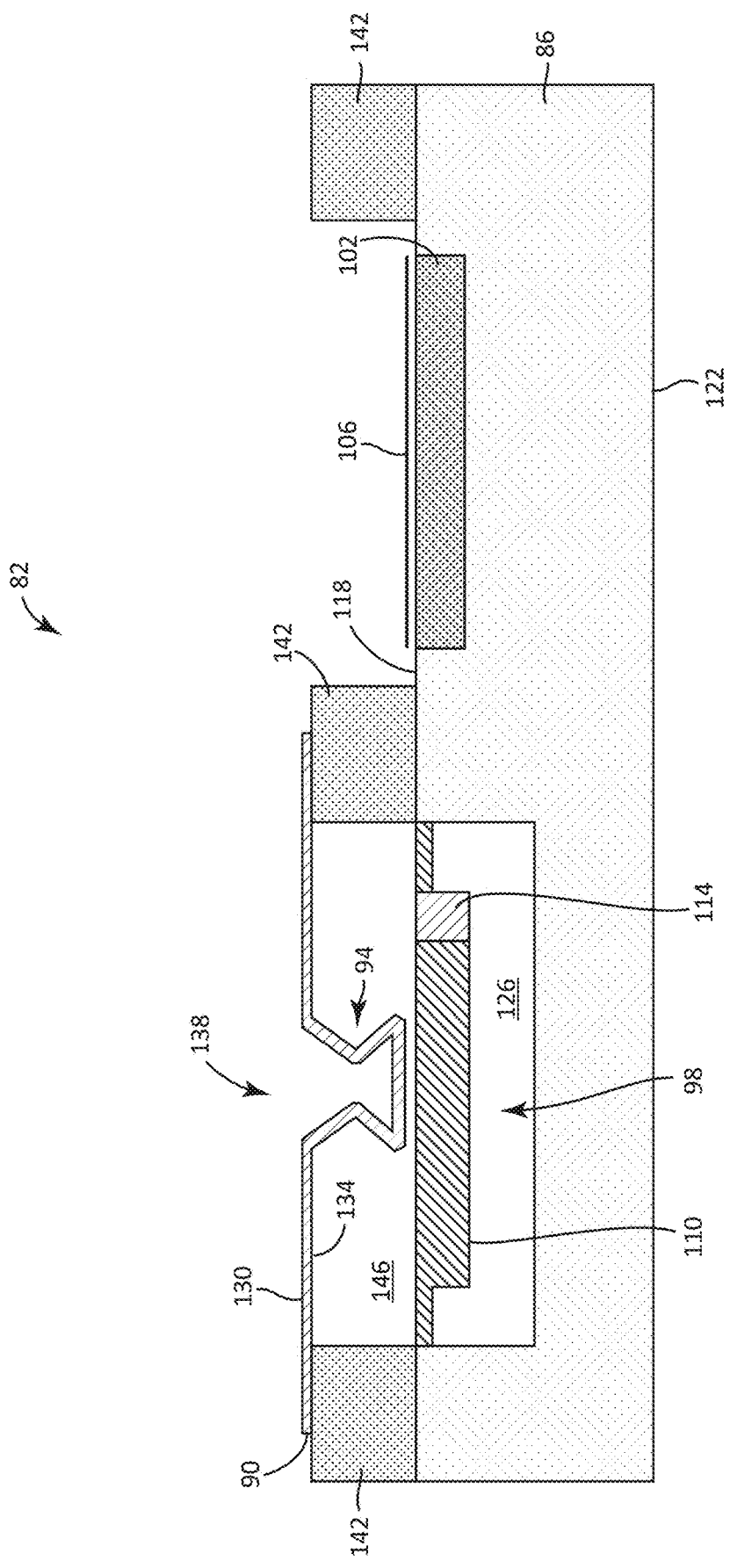
FIG. 3 is a cross-sectional view of a microphone system including a dielectric comb and a bellow diaphragm according to implementations of the present disclosure.

FIG. 3 shows a cross-sectional view of a microphone device 82 according to an implementation of the present disclosure. While the microphone device 82 illustrated in FIG. 3 and subsequent figures of the present disclosure represents illustrative implementations of the features of the present disclosure, it should be understood that, in some implementations, other structural features may be utilized to implement the features described above with reference to FIGS. 1-2 and described in further detail below.

Figure 17:
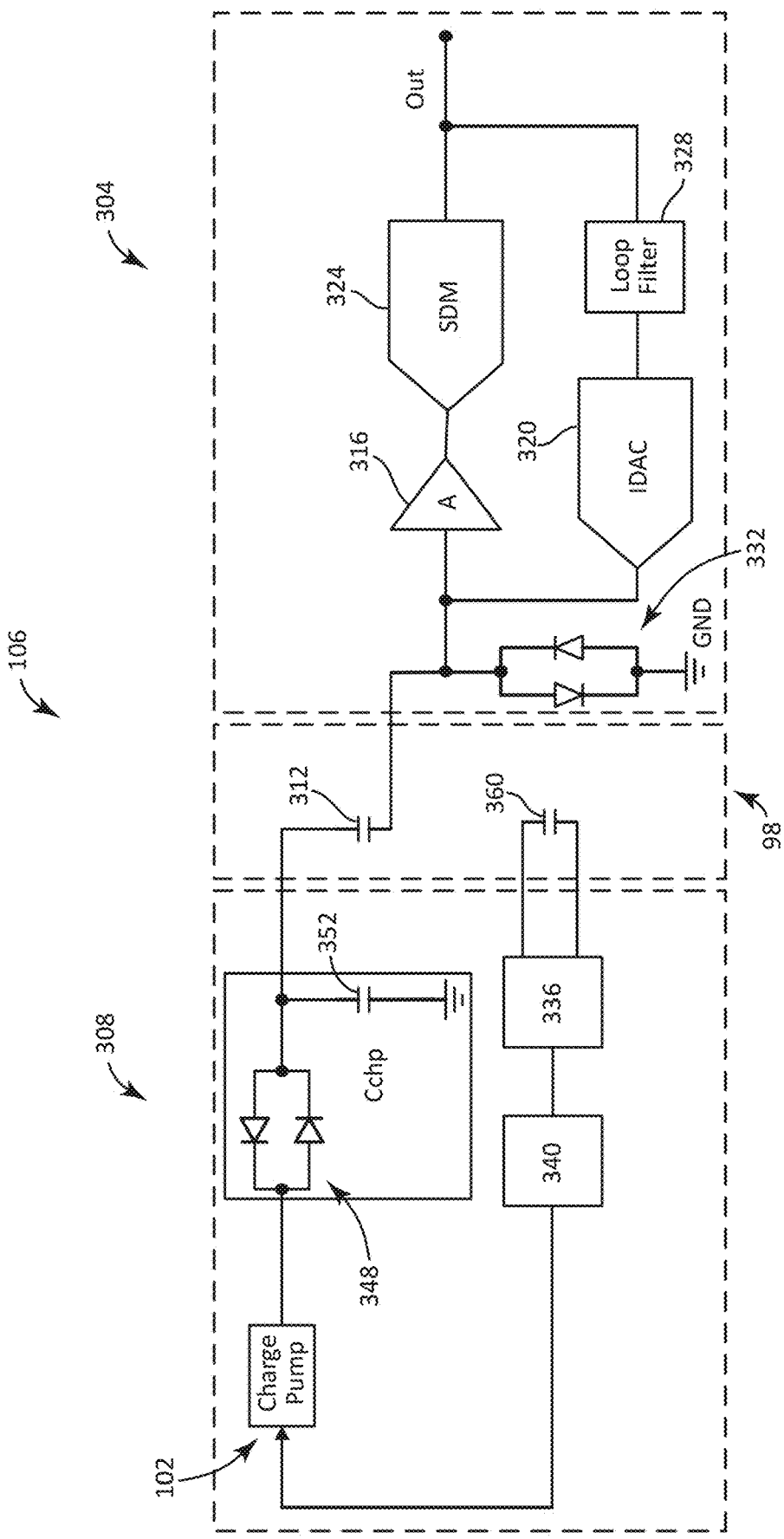
FIG. 17 is a representation of a control loop of the microphone system of FIG. 3 and/or FIG. 13 including a dielectric comb according to implementations of the present disclosure.

The microphone device 82 includes a substrate or housing 86, a bellow diaphragm 94, a dielectric comb 98, a charge pump system 102, and an integrated circuit (IC) 106. Together, these components form a MEMS transducer configured to sense acoustic activity and changes in atmospheric pressure. The dielectric comb 98 includes an acoustic sensing portion 110 and a feedback or atmospheric pressure sensing portion 114. The IC 106 includes an acoustic processing portion or acoustic signal detection loop 304 and an atmospheric processing portion or an atmospheric pressure compensation loop 308 (FIG. 17). As is discussed in greater detail below, the acoustic sensing portion 110 is coupled to the acoustic signal detection loop 304 and the atmospheric pressure sensing portion 114 is coupled to the atmospheric pressure compensation loop 308. FIG. 3 illustrates the IC 106 formed on the substrate 86 of the microphone device. In other implementations, the IC 106 may be formed on one or more substrates separate from the substrate 86. In such implementations, the IC 106 can be connected to the microphone device 82 using a combination of wires, traces, and/or leads.

Figure 4:
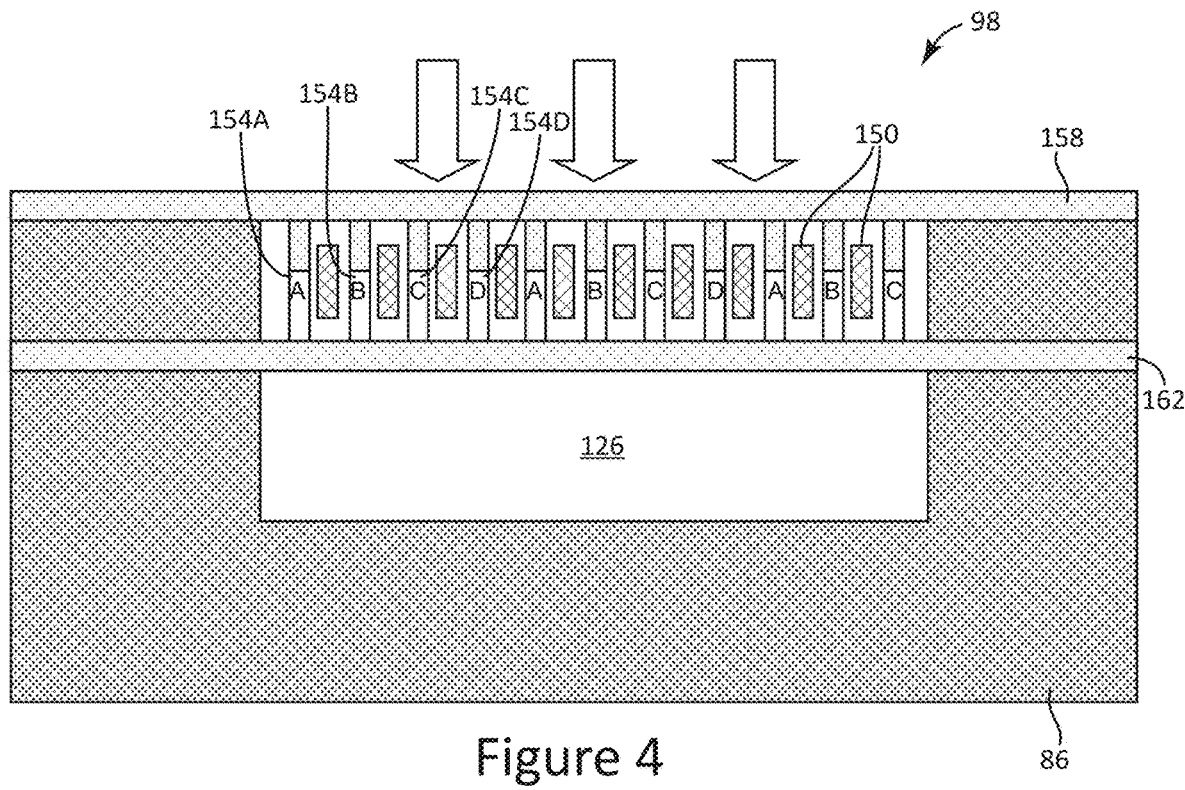
FIG. 4 is a schematic view of an example dielectric comb of the microphone system of FIG. 3 according to some implementations of the present disclosure.

The acoustic sensing portion 110 and the atmospheric pressure sensing portion 114 are shown schematically as blocks in FIG. 3. As is indicated by the relative size of the acoustic sensing portion 110 and the atmospheric pressure sensing portion 114, in the illustrated implementation the acoustic sensing portion 110 forms substantially 90% of the dielectric comb 98 and the atmospheric pressure sensing portion 114 forms substantially 10% of the dielectric comb 98. In other implementations, the acoustic sensing portion 110 and the atmospheric pressure sensing portion 114 can form different proportions of the dielectric comb 98. For example, in some implementations, the acoustic sensing portion 110 forms substantially 80% of the dielectric comb 98 and the atmospheric pressure sensing portion 114 forms substantially 20% of the dielectric comb 98. Accordingly, in some embodiments, the acoustic sensing portion 110 has higher a resolution (e.g. a larger proportion of the comb) than the atmospheric pressure sensing portion 114, which allows the acoustic sensing portion 110 to receive a stronger electrical signal that allows the acoustic sensing portion 110 to be sensitive to smaller changes in pressure. However, any ratio of acoustic sensing portions to atmospheric sensing portions may be utilized in other implementations. In some implementations, as illustrated in FIG. 3, the acoustic sensing portion 110 and the atmospheric pressure sensing portion 114 may be segregated into distinct portions of the dielectric comb 98, while in other implementations, components of the acoustic sensing portion 110 and the atmospheric pressure sensing portion 114 may be distributed throughout the dielectric comb 98 (i.e., intermingled with one another), as is shown in FIG. 4 and described in greater detail below.

The substrate 86 includes a front surface (first surface) 118 and an opposing back surface (second surface) 122. The dielectric comb 98, the charge pump system 102, and the IC 106 are positioned on the front surface 118 of the substrate 86. A first cavity 126 is formed in the front surface 118 of the substrate 86. The dielectric comb 98 is positioned in an upper portion of the first cavity 126 and extends across the first cavity 126 to enclose the first cavity 126.

The bellow diaphragm 94 is structured to convert a pressure change into a physical motion that can be sensed by the dielectric comb 98. For example, in the implementation illustrated in FIG. 3, the bellow diaphragm 94 is held in physical contact with the dielectric comb 98 by the atmospheric pressure and exerts a force on the dielectric comb 98. Changes in pressure (e.g., changes in the atmospheric pressure and/or changes in acoustic pressure) cause the bellow diaphragm 94 to deflect (e.g. upwards or downwards) and increase or decrease the force exerted on the dielectric comb 98. The bellow diaphragm 94 includes an outer bellow plate 90. The outer bellow plate 90 includes a front surface (first surface) 130 and an opposing back surface (second surface) 134. The outer bellow plate 90 includes a through hole 138 that extends between the front surface 130 and the back surface 134 of the outer bellow plate 90. Viewed in a direction that is normal to the front surface 130 of the outer bellow plate 90, the outer bellow plate 90 has a substantially annular shape. As is shown in FIG. 3, a plurality of bellow plates are secured to the bellow structure 90 so that an upper portion of one of the plurality of bellow plates surrounds the through hole 138, as is described in more detail below. When the bellow diaphragm 94 is under atmospheric pressure, a lower portion of the bellow diaphragm 94 contacts the dielectric comb 98. When the bellow diaphragm 94 is not under the influence of the atmospheric pressure (e.g., if the microphone device 82 were placed in a vacuum chamber to remove the influence of the atmospheric pressure), the lower portion of the bellow diaphragm 94 is spaced from the dielectric comb 98, as shown in FIG. 3. In the illustrated implementation, the lower portion of the bellow diaphragm 94 is spaced approximately 10-20 μm from the dielectric comb 98 when the bellow diaphragm 94 is not under the influence of the atmospheric pressure.

The back surface 134 of the outer bellow plate 90 is secured to a portion of the front surface 118 of the substrate 86 using a bonding material 142. The outer bellow plate 90, the front surface 118 of the substrate 86, and an upper surface of the dielectric comb 98 define a second cavity 146 therebetween. In some implementations, the back surface 134 of the outer bellow plate 90 is secured to the front surface 118 of the substrate 86 in a vacuum so that the first cavity 126 and the second cavity 146 are vacuums. As used herein, the term "vacuum" is defined as pressures less than or equal to 10 Pa. In such an implementation, the bonding material 142 fuses the front surface 118 of the substrate 86 to the back surface 134 of the outer bellow plate 90. The bonding material 142 forms a solid layer extending over the front surface 118 of the surface. In the illustrated implementation, the bonding material 142 is removed proximate the dielectric comb 98 and the charge pump system 102. As shown in FIG. 3, the second cavity 146 is formed between the back surface 134 of the outer bellow plate 90, the bonding material 142, and the dielectric comb 98. The bellow diaphragm 94 can extend and retract within the second cavity 146. In implementations in which the first cavity 126 and the second cavity 146 are vacuums, the lack of air (due to the presence of the vacuum) reduces noise by reducing the friction of the bellow diaphragm 94 as the bellow diaphragm 94 extends and retracts within the second cavity 146. Similarly, the vacuum conditions in the first cavity 126 and the second cavity 146 reduce the friction of the dielectric comb 98 as the dielectric comb 98 deflects upwardly and downwardly in the first cavity 126 and the second cavity 146 in response to extension and retraction of the bellow diaphragm 94.

Figure 5:
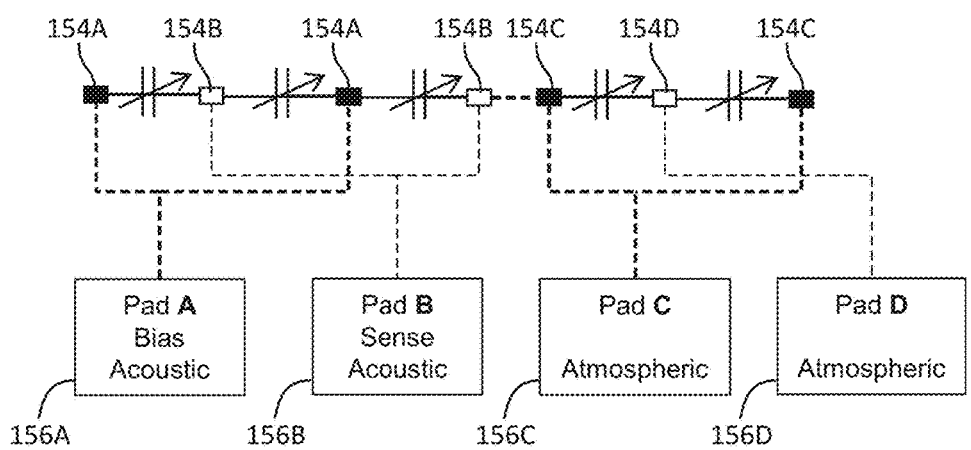
FIG. 5 is a schematic representation of an interface between the dielectric comb and an integrated circuit according to some implementations of the present disclosure.

FIG. 4 illustrates a schematic representation of the dielectric comb 98 according to an implementation of the present disclosure. FIG. 5 is a schematic illustration of the connections between a plurality of conductors 154A, 154B, 154C, 154D with the IC 106. The dielectric comb 98 is positioned within the first cavity 126 of the substrate 86. The dielectric comb 98 includes a plurality of dielectric bars 150, the plurality of conductors 154A-154D, a first isolator 158, and a second isolator 162. The dielectric bars 150 are fixedly secured to sidewalls forming the first cavity 126. The conductors 154A-154D are secured between the first isolator 158 and the second isolator 162. The first isolator 158 and the second isolator 162 are secured to the substrate 86 and are movable with respect to the first cavity 126. Accordingly, as deflection of the bellow diaphragm 94 causes movement of the dielectric comb 98, the conductors 154A-154D are displaced relative to the dielectric bars 150 as is discussed in greater detail below.

As described above, the dielectric comb 98 includes the atmospheric pressure sensing portion 114 and the acoustic sensing portion 110. In the implementation of FIG. 4, the components of the atmospheric pressure sensing portion 114 and the acoustic sensing portion 110 are distributed throughout the dielectric comb 98. The conductors 154A and 154B form the acoustic sensing portion 110 and are coupled to the acoustic pressure compensation loop 304. The conductors 154C and 154D form the atmospheric pressure sensing portion 114 and are coupled to the atmospheric pressure compensation loop 308. The implementation of FIG. 4 shows an equal number of the conductors 154A and 154B for sensing acoustic forces and conductors 154C and 154D for sensing atmospheric forces. In other implementations, different proportions of conductors for sensing acoustic forces and conductors for sensing atmospheric forces may be used. For example, in some implementations, 90% of the conductors are for sensing acoustic forces and 10% of the conductors are for sensing atmospheric forces. For example, in some implementations, the acoustic sensing portion 110 forms substantially 80% of the dielectric comb 98 and the atmospheric pressure sensing portion 114 forms substantially 20% of the dielectric comb 98.

For example, in the implementation of FIG. 4, the conductors 154A and 154B form the acoustic sensing portion 110 and are coupled to the acoustic signal detection loop 304. More specifically, as is shown schematically in FIG. 5, an end of each of the conductors 154A is connected in parallel to the acoustic signal detection loop 304 by a pad 156A using a combination of leads and traces to form an electrically conductive path between each of the conductors 154A and the acoustic signal detection loop 304. Similarly, an end of each of the conductors 154B is connected in parallel to the acoustic signal detection loop 304 by the pad 156B using a combination of leads and traces to form an electrically conductive path between each of the conductors 154B and the acoustic signal detection loop 304. An end of each of the conductors 154C is connected in parallel to the atmospheric pressure compensation loop 308 by the pad 156C using a combination of leads and traces to form an electrically conductive path between each of the conductors 154C and the atmospheric pressure compensation loop 308. Similarly, an end of each of the conductors 154D is connected in parallel by the pad 156D to the atmospheric pressure compensation loop 308 using a combination of leads and traces to form an electrically conductive path between each of the conductors 154D and the atmospheric pressure compensation loop 308.

The dielectric comb 98 is structured so that each of the conductors 154A-154D is positioned adjacent at least one of the dielectric bars 150. The dielectric bars 150 are spaced with respect to the conductors 154A-154D to restrict movement of the conductors 154A-154D in the vertical direction as dielectric comb 98 moves. As shown in FIG. 4, at least a portion of adjacent conductors 154A-154D and dielectric bars 150 overlap. A bias current is applied to each of the conductors 154A-154D and a bias voltage is applied across adjacent conductors 154A-154D. The dielectric bars 150 are made of an electrically insulating dielectric material and prevent the attractive forces between adjacent conductors 154A-154D from causing the conductors 154A-154D to collapse into each other. An amount of overlap between the dielectric bars 150 and the conductors 154A-154D varies as forces are applied to the dielectric comb 98 by the bellow diaphragm 94. As is described in greater detail below, varying the amount of overlap between the dielectric bars 150 and the conductors 154A-154D causes the bias voltage applied cross adjacent conductors 154A-154D to change, generating an electrical signal.

The isolators 158, 162 are formed of a resilient material that allows the isolators 158, 162 (and thus the dielectric comb 98) to deflect downward in response to an increased force exerted on the dielectric comb 98 by the bellow diaphragm 94 (e.g. downward deflection of the bellow diaphragm 94) in response to the bellow diaphragm 94 experiencing an increase in pressure. The isolators 158, 162 deflect upward in response to a reduction in the force exerted on the isolators 158,162 by the bellow diaphragm 94 (e.g. upward deflection of the bellow diaphragm 94). The isolators 158, 162 are grounded to electrically isolate the dielectric comb 98.

Figure 6:
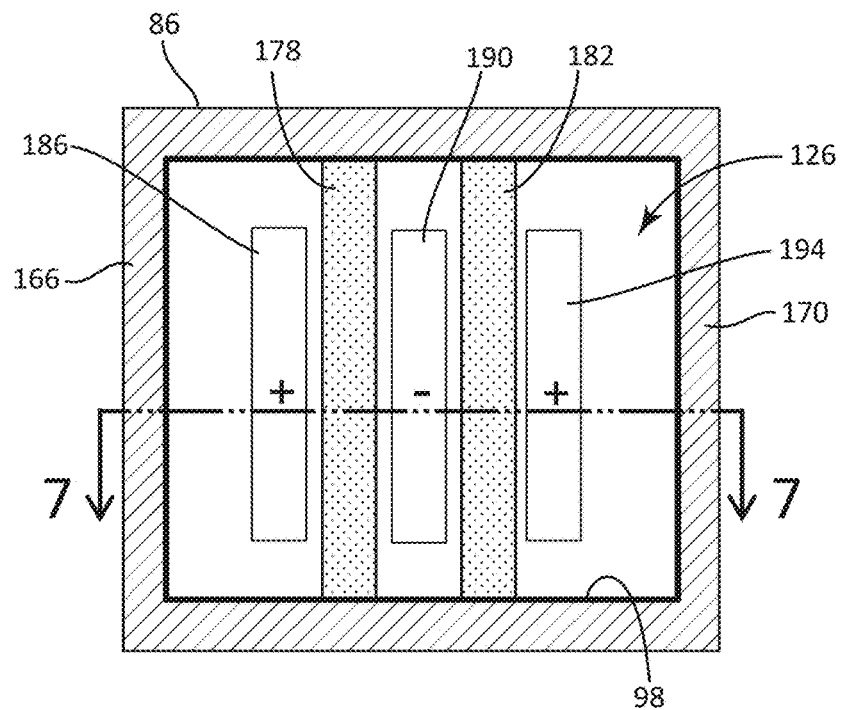
FIG. 6 is a representation of a top view of another example dielectric comb for the microphone system of FIG. 3 according to implementations of the present disclosure.

FIG. 6 is a simplified top view of the dielectric comb 98 according to an implementation of the present disclosure. Further, while a partial comb structure is illustrated in FIG. 6, it should be understood that the dielectric comb 98 may include a larger comb structure (e.g., more conductors and dielectric bars) than are illustrated in FIG. 6. The conductors shown in FIG. 6 can form either the atmospheric pressure sensing portion 114 or the acoustic sensing portion 110 of the dielectric comb 98.

Figure 7:
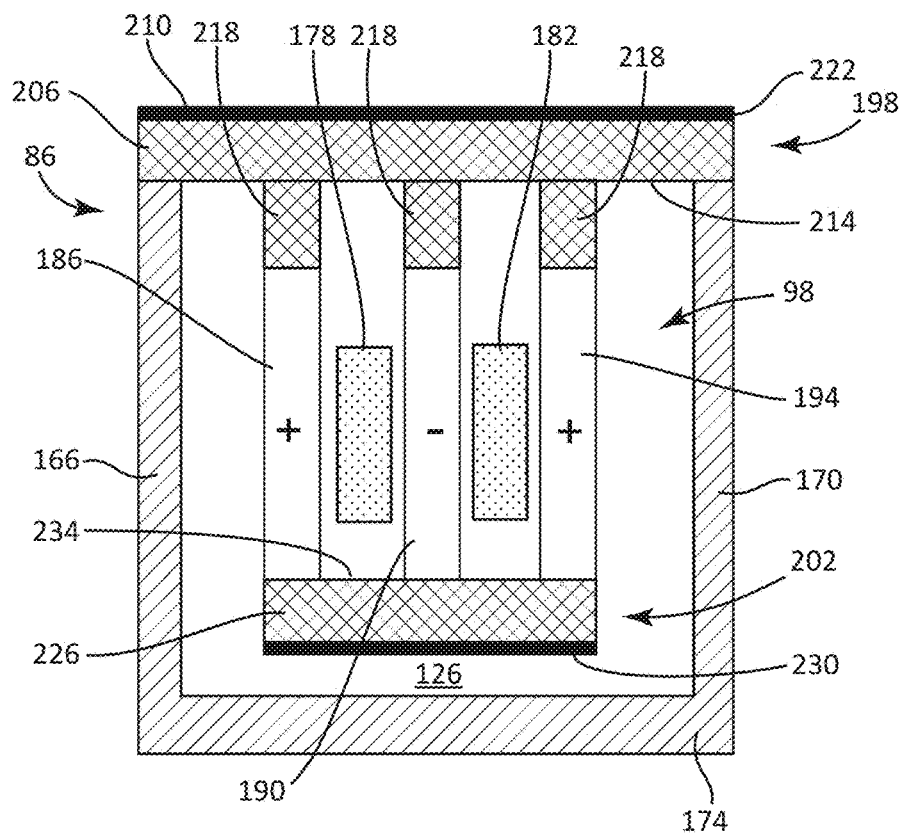
FIG. 7 is a representation of a cross-sectional view of the dielectric comb taken along lines 7-7 of FIG. 6.

The dielectric comb 98 is shown positioned within the first cavity 126 formed in the substrate 86. The first cavity 126 is defined by a first sidewall 166, a second sidewall 170, and a bottom wall 174 (FIG. 7). In the illustrated implementation, the first cavity 126 is a vacuum. A first dielectric bar 178, a second dielectric bar 182, a first conductor 186, a second conductor 190, and a third conductor 194 are positioned within the first cavity 126. The first dielectric bar 178 and the second dielectric bar 182 are fixedly secured within the first cavity 126 (e.g. to the sidewalls 166, 170). The first dielectric bar 178 and the second dielectric bar 182 are made of an electrically insulating material. The first dielectric bar 178 is spaced from the first sidewall 166 so that the first conductor 186 can be positioned between the first dielectric bar 178 and the first sidewall 166. The first dielectric bar 178 is spaced from the second dielectric bar 182 so that the second conductor 190 can be positioned between the first dielectric bar 178 and the second dielectric bar 182. The second dielectric bar 182 is spaced from the second sidewall 170 so that the third conductor 194 can be positioned between the second dielectric bar 182 and the second sidewall 170. A biasing current is applied to the conductors 186, 190, 194. In other implementations, the dielectric comb 98 can have more conductors or fewer conductors than shown in FIGS. 6-7, as long as the dielectric bars are positioned between adjacent conductors and a bias voltage is applied across adjacent conductors. As is described in more detail below, the conductors 186, 190, 194, are movable with respect to the dielectric bars 178, 182 and the sidewalls 166, 170. Positioning the dielectric bars 178, 182 between adjacent conductors 186, 190, 194 restricts the conductors 186, 190, 194 to movement in a generally vertical direction. In some implementations the dielectric bars 178, 182 and adjacent conductors 186, 190, 194 are trapezoidal in shape with sidewalls up to 3° from vertical. The positioning of the dielectric bars 178, 182 between adjacent conductors 186, 190, 194 allows for the generation of large vertical electrostatic forces between dielectric bars 178, 182 and adjacent conductors 186, 190, 194 without the risk of electrostatic instability and collapse between adjacent conductors 186, 190, 194.

FIG. 7 is a cross-sectional view of the dielectric comb 98 according to an implementation of the present disclosure. The dielectric comb 98 further includes a first isolator 198 and a second isolator 202. The first isolator 198 and the second isolator 202 are made of a resilient material and deflect in response to forces exerted on the dielectric comb 98 by the bellow diaphragm 94. The isolators 198, 202 can be made of silicon nitride, undoped polycrystalline silicon, siliconoxynitride, carbon (as diamond), aluminum oxide, hafnium oxide, and zirconium dioxide. The first isolator 198 extends across an opening of the first cavity 126. The first isolator 198 includes a first insulating layer 206 and a first conducting layer 210. An inner (e.g. proximate the conductors 186, 190, 194) surface 214 of the first insulating layer 206 includes protrusions 218 that extend into the first cavity 126 and are secured to a first end of each of the conductors 186, 190, 194. The first conducting layer 210 extends across an outer surface 222 of the first insulating layer 206. In some implementations, the first conducting layer 210 can be grounded. In other implementations, the first conducting layer 210 can be connected to an electrical potential. The second isolator 202 is positioned within the first cavity 126. The second isolator 202 includes a second insulating layer 226 and a second conducting layer 230. An inner surface 234 of the second insulating layer 226 extends between a second end of each of the conductors 186, 190, 194. In the implementation illustrated in FIG. 7, the inner surface 234 of the second insulating layer 226 is substantially planar. In other implementations, the inner surface 234 of the second insulating layer 226 may include protrusions similar to the protrusions 218. The second conducting layer 230 extends across an outer surface of the second insulating layer 226. In some implementations, the second conducting layer 230 can be grounded. In other implementations, the second conducting layer 230 can be connected to an electrical potential. The protrusions 218, 222 may be used to form a desired spacing/orientation of the conductors 186, 190, 194 within the dielectric comb 98.

Figure 8:
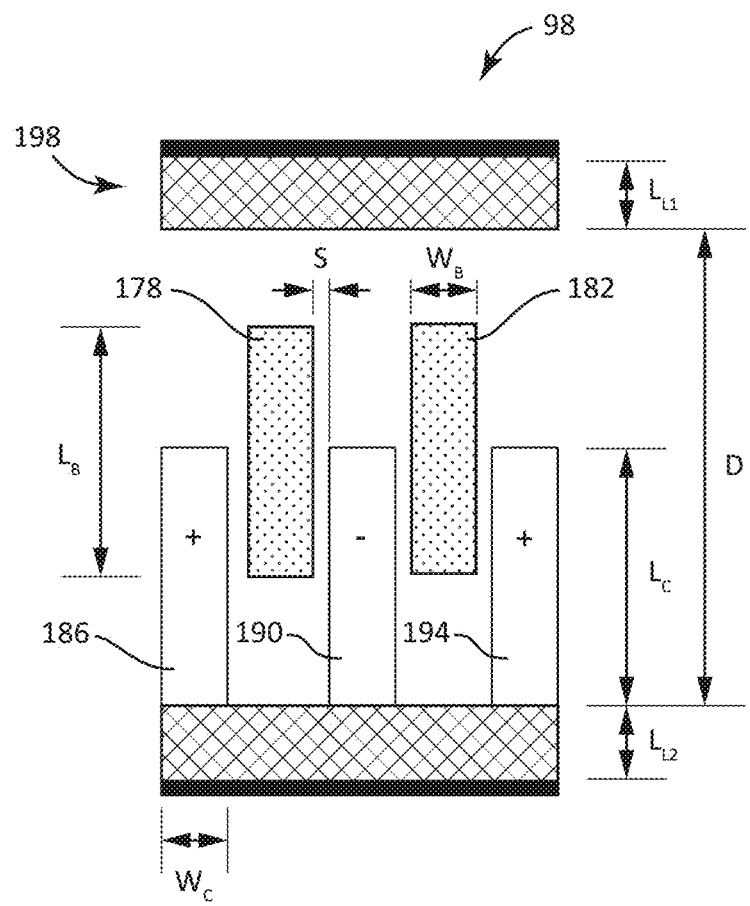
FIG. 8 is a partial view of the cross-sectional view of the dielectric comb of FIG. 7.

FIG. 8 is a partial view of the cross-section of the dielectric comb shown in FIG. 7. As shown in FIG. 8, the conductors 186, 190, 194 can have a conductor length $L_C$, that can range between 4 microns (μm) and 6 μm. The conductors 186, 190, 194 can have a conductor width $W_C$ that can range between 0.8 μm and 1.2 μm. In some implementations, the conductors 186, 190, 194 are made from polycrystalline silicon that has been doped. In some implementations, the dopants can be boron, phosphorous, and arsenic. In some embodiments, doping concentrations can range between approximately $10^{18}$ atoms/cm$^3$ of dopant and approximately $10^{20}$ atoms/cm$^3$ of dopant. In other implementations, other dopants and/or other doping concentrations can be used. The dielectric bars 178, 182 can have a dielectric bar length $L_B$ that can range between 150 μm and 500 μm. The dielectric bars 178, 182 can have a dielectric bar width WB that can range between 1 μm and 5 μm. A spacing S between adjacent conductors 186, 190, 194 and dielectric bars 178, 182 can range between 160 nm and 500 nm. In some implementations, the first dielectric bar 178 and the second dielectric bar 182 are made from silicon nitride or polycrystalline silicon that has not been doped.

With continued reference to FIG. 8, the first insulating layer 206 can have a first insulating layer length $L_{L1}$ that can range between 1.6 μm and 2.4 μm. The second insulating layer 226 can have a second insulating layer length $L_{L2}$ that can range between 1.6 μm and 2.4 μm. In the illustrated implementation, the first insulating layer length $L_{L1}$ is generally the same as the second insulating layer length $L_{L2}$. In other implementations, the first insulating length $L_{L1}$ can be different than the second insulating length $L_{L2}$. In some implementations, the isolators 198, 202 are made from silicon nitride, polycrystalline silicon, or other polymers. In the illustrated implementation, the inner surface 214 of the first insulating layer 206 can be positioned a distance D from the inner surface 234 of the second insulating layer 226. The distance D can range between 8 μm and 12 μm. In the illustrated implementation, the distance D is generally twice the conductor length $L_C$. It should be noted that the example values provided herein are for purposes of illustration only, and any values can be utilized for various dimensions without departing from the scope of the present disclosure.

Figure 9:
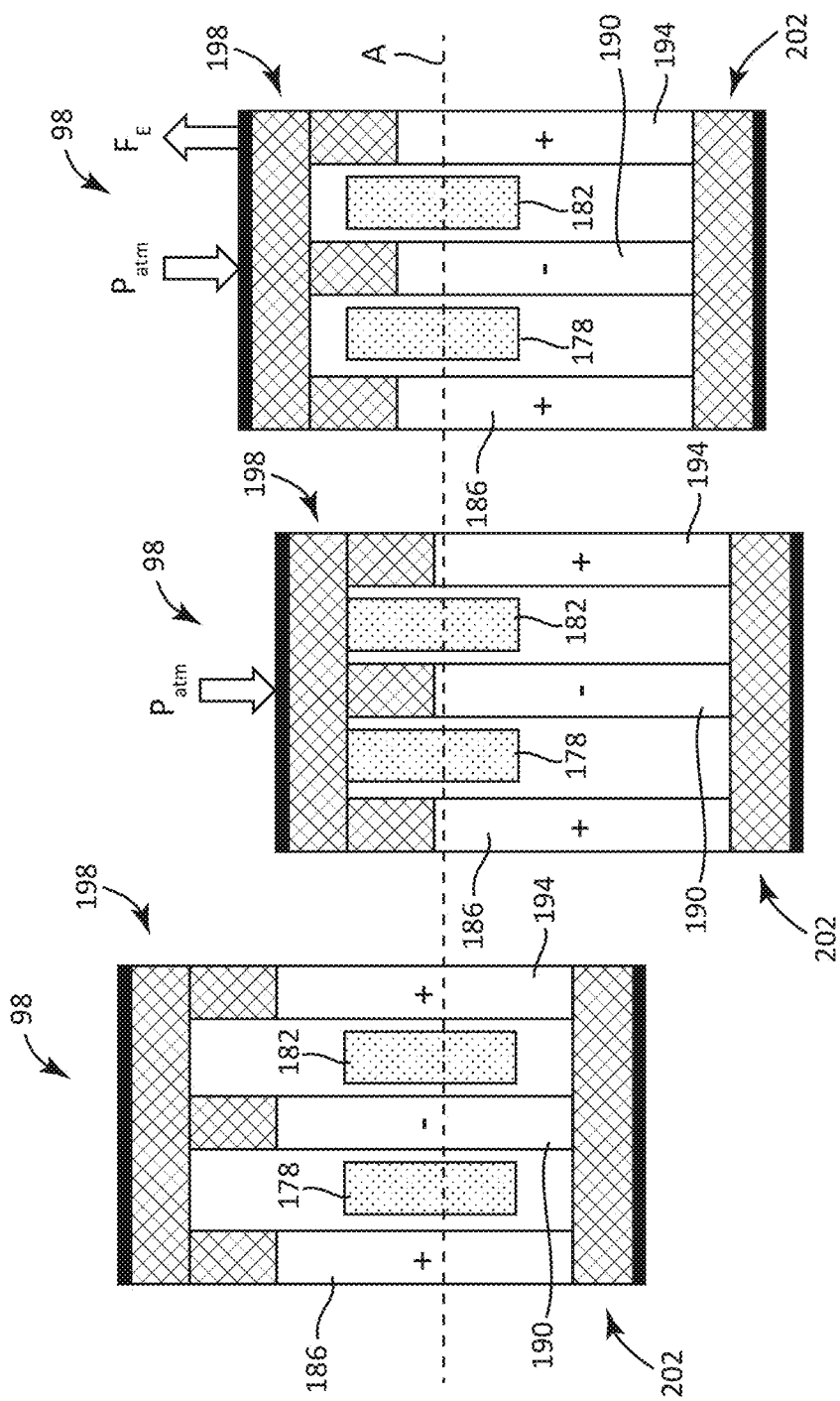
FIG. 9A illustrates the dielectric comb of FIG. 3 in a vacuum.
FIG. 9B illustrates the dielectric comb of FIG. 3 subjected to a force due to an atmospheric pressure.
FIG. 9C illustrates the dielectric comb of FIG. 3 exerting an electrostatic force to offset a portion of the force due to the atmospheric pressure.

FIGS. 9A-9C illustrate deflection of the first isolator 198 and the second isolator 202 of the dielectric comb 98 in response to an external applied force (e.g. an applied force exerted by the bellow structure 90 and the bellow diaphragm 94 due to a change in the atmospheric pressure and/or the acoustic pressure) according to an implementation of the present disclosure. FIG. 9A illustrates the dielectric comb 98 when the dielectric comb 98 is not subjected to external applied forces (e.g. the dielectric comb 98 is at a rest position in a vacuum). When the dielectric comb 98 is not subjected to external applied forces, the midpoints of the conductors 186, 190, 194 and the dielectric bars 178, 182 are generally aligned with the axis A, so that a large overlap area exists between the conductors 186, 190, 194 and the adjacent dielectric bars 178, 182.

FIG. 9B illustrates deflection of the dielectric comb 98 in response to a force applied by the atmospheric pressure. Since the dielectric bars 178, 182 are fixed to the first cavity 126, the dielectric bars 178, 182 do not deflect as a result of the force exerted by the atmospheric pressure. Accordingly, the midpoints of the dielectric bars 178, 182 remain aligned with the axis A. The force applied by the atmospheric pressure causes the first isolator 198 and the second isolator 202 to deflect downward. The downward deflection of the isolators 198, 202 causes the conductors 186, 190, 194, to deflect downward so that the midpoints of the conductors 186, 190, 194 are no longer aligned along the axis A, reducing an overlap area between the conductors 186, 190, 194 and the adjacent dielectric bars 178, 182.

As shown in FIG. 9C, when the conductors 186, 190, 194 are displaced relative to the dielectric bars 178, 182, the conductors 186, 190, 194 extend past the dielectric bars 178, 182, exposing adjacent conductors 186, 190, 194 to each other. A capacitance is generated between the adjacent conductors 186, 190, 194. The atmospheric pressure sensing capacitor 360 senses a capacitance across the adjacent conductors 186, 190, 194 and sends a signal to the atmospheric pressure compensation loop 308 indicative of the capacitance. In response, and as discussed in greater detail below, the atmospheric pressure compensation loop 308 commands the charge pump system 102 system to increase or decrease a biasing charge sent to the conductors 186, 190, 194. The biasing charge generates an electrostatic force, $F_E$, pulling the conductors 186, 190, 194 back in the direction of the dielectric bars 178, 182. Thus, the electrostatic force $F_E$ opposes a portion of the force applied by the atmospheric pressure and biases the movable portions of the dielectric comb 98 back towards the rest position, counteracting the deflection caused by fluctuations in the atmospheric pressure.

Figure 10:
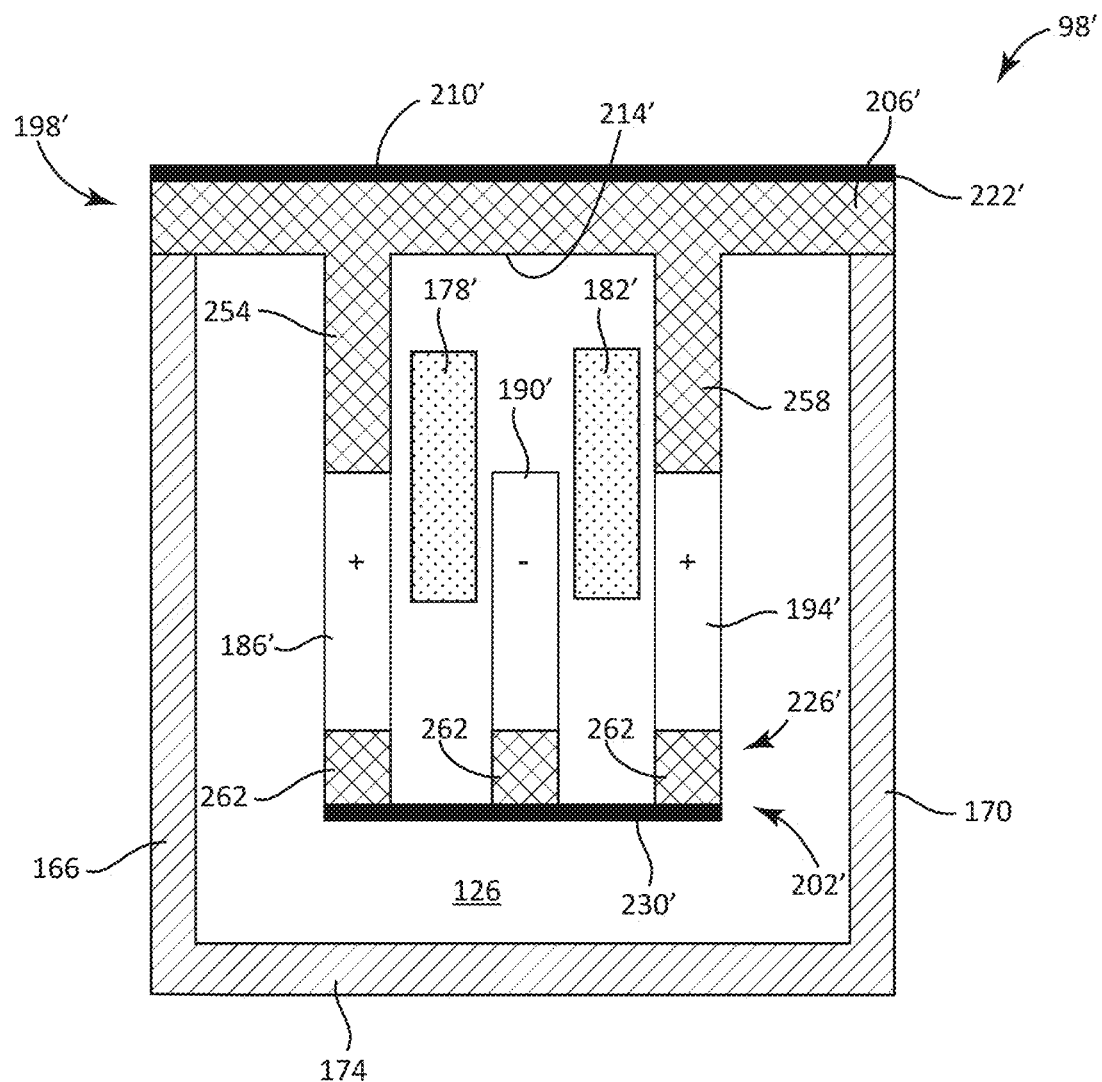
FIG. 10 is a representation of cross-sectional view of a dielectric comb of a microphone according to another implementation of the present disclosure.

FIG. 10 is a cross-sectional view of a dielectric comb 98' according to another implementation of the present disclosure. The dielectric comb 98' is generally similar to the dielectric comb 98 described in FIGS. 6-9. Like parts in the implementation of FIG. 10 will be indicated using the prime symbol "'". In the implementation shown in FIG. 10, the first insulating layer 206' includes a first protrusion 254 extending between the inner surface 214' and the first conductor 186' and a second protrusion 258 extending between the inner surface 214' and the third conductor 194'. The second insulating layer 226' is defined by protrusions 262 extending between the second ends of each of the conductors 186', 190', 194'. In the illustrated implementation, the second insulating layer 226' does not extend across a portion of the second conducting layer 230 that is between the conductors 186', 190', 194'. The implementation of FIG. 10 has less insulating material than the implementation of FIGS. 6-9. The reduction in the amount of insulating material can reduce a parasitic capacitance of the dielectric comb 98'. Parasitic capacitance can lead to noise in the signals sent by the dielectric comb 98, 98'.

Figure 11:
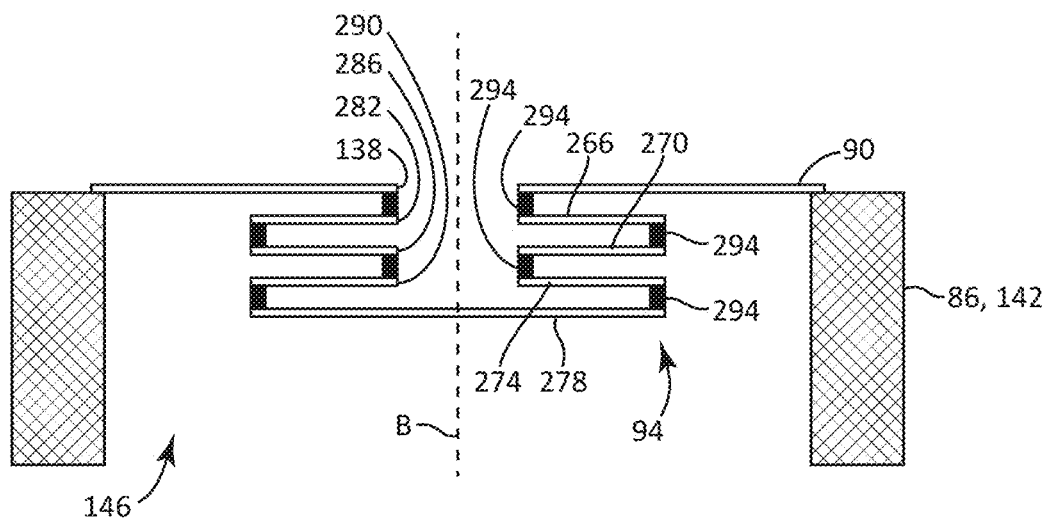
FIG. 11 is a cross-sectional view of the bellow diaphragm of FIG. 3 in a vacuum.
Figure 12:
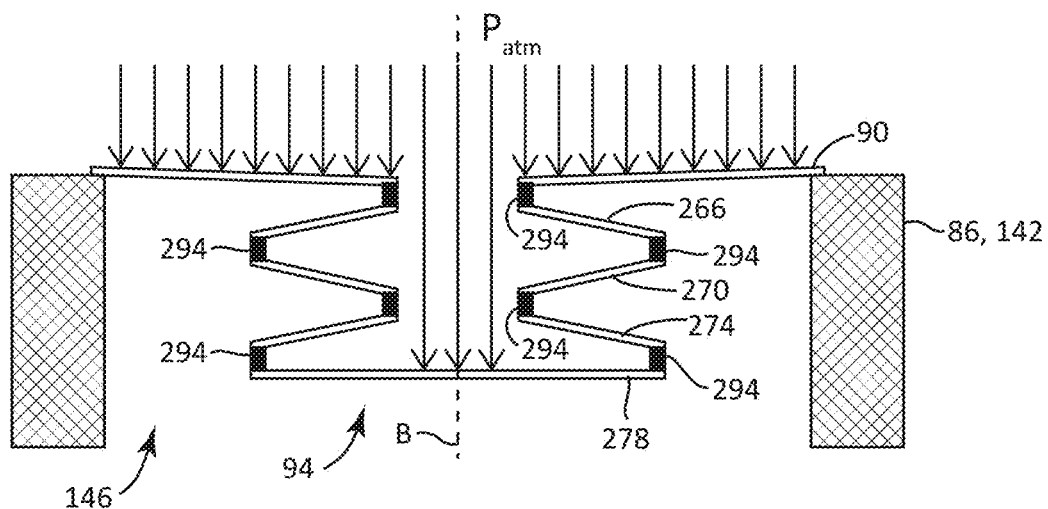
FIG. 12 is a cross-sectional view of the bellow diaphragm of FIG. 3 subjected to a distributed force exerted by an atmospheric pressure and/or an acoustic pressure.

FIGS. 11 and 12 are cross-sectional detail views of the bellow diaphragm 94 of the microphone device 82 of FIG. 3 according to an implementation of the present disclosure. The bellow diaphragm 94 is structured to deflect (e.g. upward or downward) in response to an external applied force, thereby exerting an increased force on the dielectric comb 98 or a decreased force on the dielectric comb 98. FIG. 11 illustrates the bellow diaphragm 94 with the bellow diaphragm 94 not subjected to an external applied force (e.g. the bellow diaphragm 94 is in a vacuum without any externally applied pressure incident on the bellow diaphragm 94). FIG. 12 illustrates the bellow diaphragm 94 in an extended position. The bellow diaphragm 94 is in the extended position when the bellow diaphragm 94 is displaced due to an external applied force, such as a force due to an atmospheric pressure and/or an acoustic pressure. The position of the bellow diaphragm 94 may change based on changes in the atmospheric pressure and/or due to pressure changes caused by acoustic activity. The bellow diaphragm 94 is secured to the front surface 118 of the substrate 86 to form a barrier between the atmospheric pressure of the environment of the microphone device 82 and the vacuum of the first cavity 126 and the second cavity 146 (FIG. 3).

The bellow diaphragm 94 includes a first bellow plate 266, a second bellow plate 270, a third bellow plate 274, and a fourth bellow plate 278. When viewed from a direction generally normal to the bellow diaphragm 94, the bellow plates 266, 270, 274 have a generally annular structure. When viewed from a direction generally normal to the bellow structure, the fourth bellow plate 278 has a generally circular structure. A perimeter of the first bellow plate 266 is connected to the outer bellow plate 90 proximate the through hole 138. The first bellow plate 266 has a diameter smaller than a diameter of the outer bellow plate 90 and includes a through hole 282 proximate a center of the first bellow plate 266. The second bellow plate 270 is dimensioned similarly to the first bellow plate 266 and includes a through hole 286 proximate a center of the second bellow plate 270. The third bellow plate 274 is dimensioned similarly to the first bellow plate 266 and includes a through hole 290 proximate a center of the third bellow plate 274. The fourth bellow plate 278 is dimensioned similarly to the first bellow plate 266, but the fourth bellow plate 278 does not include a through hole. The bellow plates 266, 270, 274, 278 are aligned along a central axis B of the through hole 138. Bellow structure 90 and the bellow plates 266, 270, 274, 278 are mutually parallel when the bellow diaphragm 94 is not subjected to an applied force, as is shown in FIG. 11. In the illustrated implementation, the bellow plate 278 is spaced approximately 10-20 µm from the dielectric comb 98 when the bellow diaphragm 94 is not subjected to an applied force. The bellow structure 90 and the bellow plates 266, 270, 274, 278 are connected using compliant structures 294. The compliant structures 294 facilitate relative deflection between adjacent ones of the outer bellow plate 90 and the bellow plates 266, 270, 274, 278. In some implementations, the complaint structures 294 are separate from the outer bellow plate 90 and the bellow plates 266, 270, 274, 278. In other implementations, the complaint structures 294 are integrally formed with the outer bellow plate 90 and the bellow plates 266, 270, 274, 278. The compliant structures 294 between adjacent ones of the outer bellow plate 90 and the bellow plates 266, 270, 274, 278 are alternately positioned proximate an outer perimeter of the outer bellow plate 90 and the bellow plates 266, 270, 274, 278 and positioned proximate the through holes 138, 282, 286, 290. For example, as shown in FIGS. 11 and 12, the compliant structures 294 connecting the outer bellow plate 90 to the first bellow plate 266 and the compliant structures 294 connecting the second bellow plate 270 to the third bellow plate 274 are positioned proximate the through holes 138, 282 and 286, 290 respectively. The compliant structures 294 connecting the first bellow plate 266 to the second bellow plate 270 and the third bellow plate 274 to the fourth bellow plate 278 are positioned proximate the outer perimeter of the first bellow plate 266, the second bellow plate 270, the third bellow plate 274, and the fourth bellow plate 278. The compliant structures 294 are substantially annular and connect adjacent ones of the outer bellow plate 90 and the bellow plates 266, 270, 274, 278 using a gas-tight seal to maintain the vacuum inside the second cavity 146 and the first cavity 126.

The compliant structures 294 are made of a material that does not get stiff as the bellow diaphragm 94 undergoes cycles of deflection and contraction (e.g., undergoes cyclic loading) in response to and/or large applied forces caused by large applied pressures, such as the atmospheric pressure. The compliant structures 294 can have a compliance that is larger than a distance between the fourth bellow plate 278 and the dielectric comb 98. The compliance provides a measure of the flexibility of the compliant structures 294 under load (e.g., the atmospheric and/or acoustic pressure). The compliance is a ratio of the strain (e.g., elongation under load) and the stress (e.g., a ratio of an applied force to a cross-sectional area of the compliant structures 294) and provides a measure of how much a material can elongate under load without becoming rigid. When the compliance of the compliant structures 294 is larger than the distance between the fourth bellow plate 278 and the dielectric comb, the compliant structures 294 can undergo repeated cycles of extension and retraction (e.g., cyclic loading) without becoming stiff. In the illustrated implementation, the compliant structures 294 are made of a material that can take a load under substantially atmospheric pressure and maintain a compliance of approximately 1 nm/Pa-approximately 10 nm/Pa. In the illustrated implementation, the compliant structures 294 are made of a poly-silicon material. More specifically, the compliant structures 294 may be made of silicon nitrides or silicon oxides. In the illustrated implementation, the compliant structures 294, the outer bellow plate 90, and the bellow plates 266, 270, 274, 278 are made of the same material. In other implementations, the compliant structures 294, the outer bellow plate 90, and the bellow plates 266, 270, 274, 278 can be made of different materials. In the illustrated implementation, the bellow diaphragm 94 includes four bellow plates. In other implementations of the bellow diaphragm 94, more or fewer of the bellow plates can be used.

FIG. 12 shows the bellow diaphragm 94 subjected to a distributed applied force, such as a force caused by the atmospheric pressure and/or the acoustic pressure. The applied pressure causes the bellow diaphragm 94 to deflect into the extended position. Since the compliant structures 294 are alternately positioned proximate the through holes 138, 282, 286, 290, or proximate the outer perimeters of the outer bellow plate 90 and the bellow plates 266, 270, 274, the outer bellow plate 90 and the bellow plates 266, 270, 274 slant and/or elastically deform when deflected by the applied force. As shown in FIG. 12, the outer bellow plate 90 and the second bellow plate 270 are slanted in a first direction, and the first bellow plate 266 and the third bellow plate 274 are slanted in a second direction that is generally opposite the first direction. The terms "slant" and "slanted" are used to mean a non-zero angle or non-parallel angle between two components. The term "elastically deform" is used to mean a change in a shape of a component due to an applied force. Accordingly, the deflected bellow diaphragm 94 has a generally zig-zagged cross-sectional configuration when the bellow diaphragm 94 is in the extended position. As shown in FIG. 12, the fourth bellow plate 278 is not slanted or elastically deformed from the deflection caused by the applied force.

With further reference to FIG. 3, a cross-sectional area of the fourth bellow plate 278 is smaller than a cross-sectional area of the dielectric comb 98. Since the cross-sectional area of the dielectric comb 98 is larger than the cross-sectional area of the fourth bellow plate 278, the distributed force on the dielectric comb 98 due to the atmospheric pressure is reduced. This reduction in the atmospheric force on the dielectric comb 98 reduces the voltage that is applied to the conductors 186, 194 of the atmospheric pressure sensing portion 114 to counteract fluctuations in the atmospheric pressure, as is described in more detail below.

Figure 13:
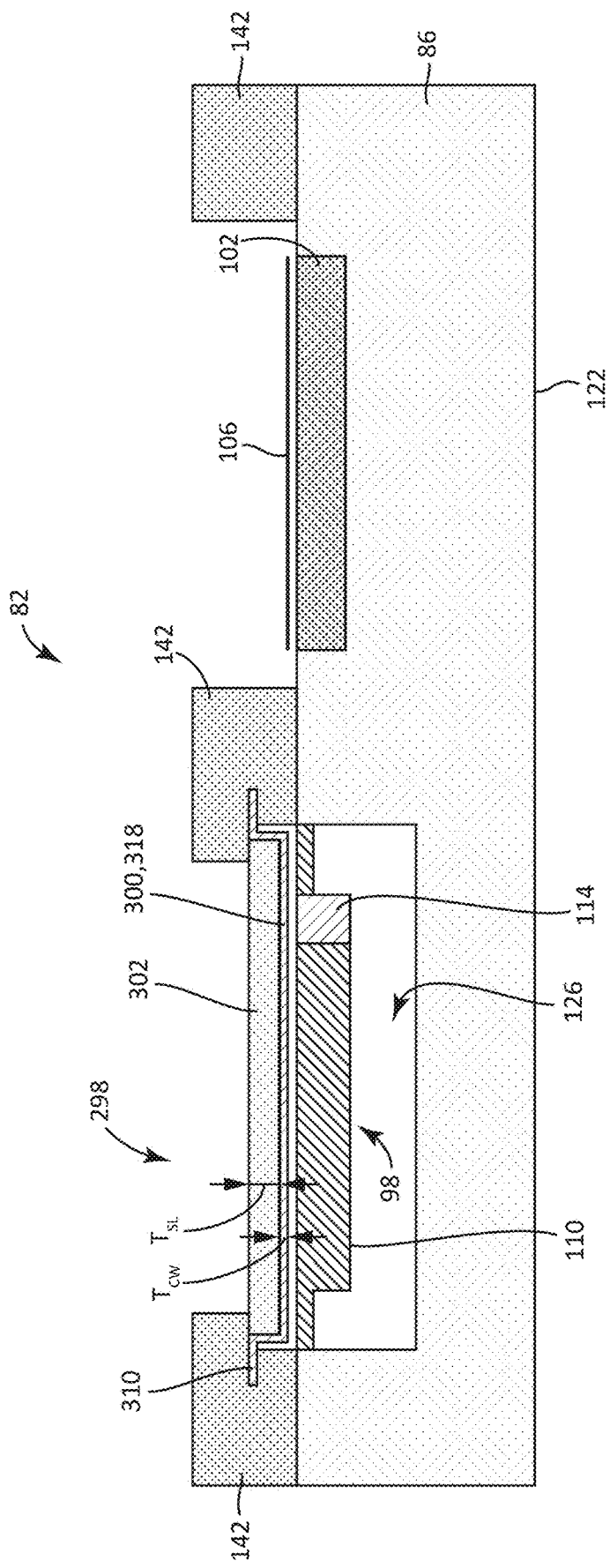
FIG. 13 is a cross-sectional view of a microphone system including a dielectric comb and a diaphragm according to another implementation of the present disclosure.

FIG. 13 illustrates a cross sectional view of the microphone device 82 including a diaphragm 298 according to an alternate implementation. The diaphragm 298 is a layered diaphragm that includes a first layer 300 and a second layer 302. The first layer 300 includes an annular flange 310, a sidewall 314, and a contact wall 318. The diaphragm 298 is secured to a portion of the front surface 118 of the substrate 86 using the bonding material 142. The diaphragm 298, the front surface 118 of the substrate 86, and an upper surface of the dielectric comb 98 define a second cavity 146 therebetween. In implementations in which the annular flange 310 is secured to the substrate 86 under vacuum conditions, the bonding material 142 fuses the front surface 118 of the substrate 86 to the annular flange 310 of the diaphragm 298. A portion of the bonding material 142 extends over a portion of the second layer 302. As shown in FIG. 3, the second cavity 146 is formed between the contact wall 318 of the bellow structure 298, the bonding material 142, and the dielectric comb 98.

The diaphragm 298 is held in physical contact with the dielectric comb 98 by the atmospheric pressure and exerts a force on the dielectric comb 98. When the diaphragm 298 is not under the influence of the atmospheric pressure, the lower portion of the diaphragm 298 is spaced from the dielectric comb 98, as shown in FIG. 13. Changes in pressure (e.g., changes in the atmospheric pressure and/or changes in acoustic pressure) cause the diaphragm 298 to deflect (e.g. upwards or downwards) and increase or decrease the force exerted on the dielectric comb 98. When the diaphragm 298 is under atmospheric pressure, at least a portion of the contact wall 318 contacts the dielectric comb 98. In some implementations, the diaphragm 298 can deflect by up to 2 μm proximate a center 322 of the diaphragm 298 (see center 322 of FIGS. 14-15) in response to changing atmospheric and/or acoustic pressures. Accordingly, the contact wall 318 can be spaced up to approximately 2 μm from the dielectric comb 98. In other implementations, the diaphragm 298 can deflect by other distances. In such implementations, the contact wall 318 can be spaced up to the deflection distance from the diaphragm 298. The first layer 300 and the second layer 302 can withstand a maximum stress of 200 MPa. In some implementations, the compliance of each of the first layer 300 and the second layer 302 is less than 5 nm/Pa. In the illustrated implementation, the compliance of each of the first layer 300 and the second layer 302 is approximately 2.7 nm/Pa.

The first layer 300 is formed of a relatively rigid material. The first layer 300 has a thickness that is large enough to hold a vacuum in the second cavity 146 by preventing atmospheric air from diffusing across the first layer 300 and into the second cavity 146. In the illustrated implementation, the first layer 300 can be a metal such as aluminum, gold, or titanium. In some implementations, the first layer 300 can have an elastic modulus of 100 GPa. In other implementations, the first layer 300 can have an elastic modulus ranging between 20 GPa and 200 GPa. As illustrated in FIG. 13, the contact wall 318 has thickness $T_c$. In the illustrated implementation, the thickness $T_c$ is approximately 0.2 μm. In other implementations, the thickness $T_c$ can range between approximately 100 nm and approximately 1 μm.

The second layer 302 is formed of a relatively elastic material. In the illustrated implementation, the second layer 302 can be a polymer such as polyimide or perylene. In some implementations, the second layer 302 has an elastic modulus of 2.5 GPa. In other implementations, the second layer 302 can have an elastic modulus that is more than 2.5 GPa. In other implementations, the second layer 302 can have an elastic modulus that is less than 2.5 GPa. More particularly, in some implementations, the second layer can have an elastic modulus ranging between 1 GPa and 10 GPa. As shown in FIG. 13, the second layer 302 has a thickness $T_{SL}$. In the illustrated implementation, the thickness $T_{SL}$ is approximately 2 μm.

Figure 14:
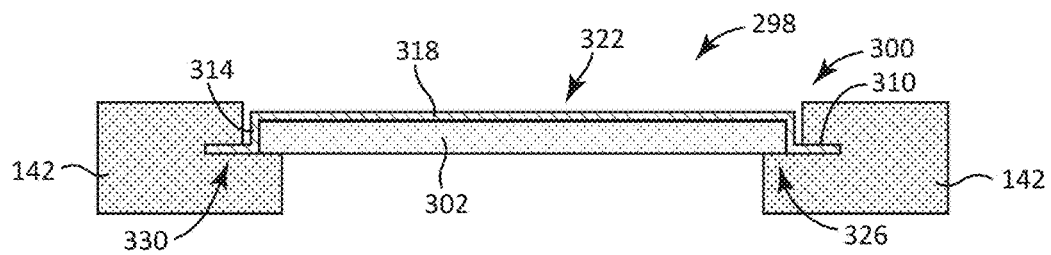
FIG. 14 is an inverted side view of the diaphragm of FIG. 13 according to implementations of the present disclosure.

FIG. 14 illustrates a cross-sectional view of the diaphragm 298 in an inverted orientation with respect to FIG. 13. Viewed in a direction that is normal to the front surface of the bellow structure 298, the diaphragm 298 has a substantially circular shape. As is shown in FIG. 13, the diaphragm 298 is secured to the substrate 86 about a circumference of the diaphragm 298 by the embedding the annular flange 310 and a circumference of the second layer 302 in the bonding material 142. The circumference of the diaphragm 298 is illustrated in cross section as a first end 326 and a second end 330. The diaphragm 298 has a generally flat configuration in at least a direction generally parallel to the applied pressures/forces generated by the applied pressures. Such a configuration reduces noise by reducing an amount of corners and/or curves interacting with the applied forces/pressures.

The diaphragm 298 is structured such that the atmospheric pressure is first exerted on the relatively compliant second layer 302 and then is exerted on the relatively rigid first layer 300 by the second layer 302. Accordingly, as is shown best in FIGS. 15-16, the concentrated forces (e.g., forces exerted on an area of the second layer 302 smaller than a total area of the second layer 302) exerted by the bonding material 142 on the diaphragm 298 generate concentrated stresses (e.g., stresses generated in an area of the second layer 302 smaller than a total area of the second layer 302) in the relatively elastic second layer 302 as the diaphragm 298 deflects with respect to the bonding material 142. Accordingly, the diaphragm 298 is structured to reduce stiffness of the diaphragm 298 by exposing the relatively elastic second layer 302 to the concentrated forces, while exposing the relatively rigid first layer 300 to distributed stresses (e.g., stresses exerted on approximately a total area of the first layer 300), while including a portion (e.g. the first layer 300) that is sufficiently thick to maintain a vacuum in the second cavity 146.

Figure 15:
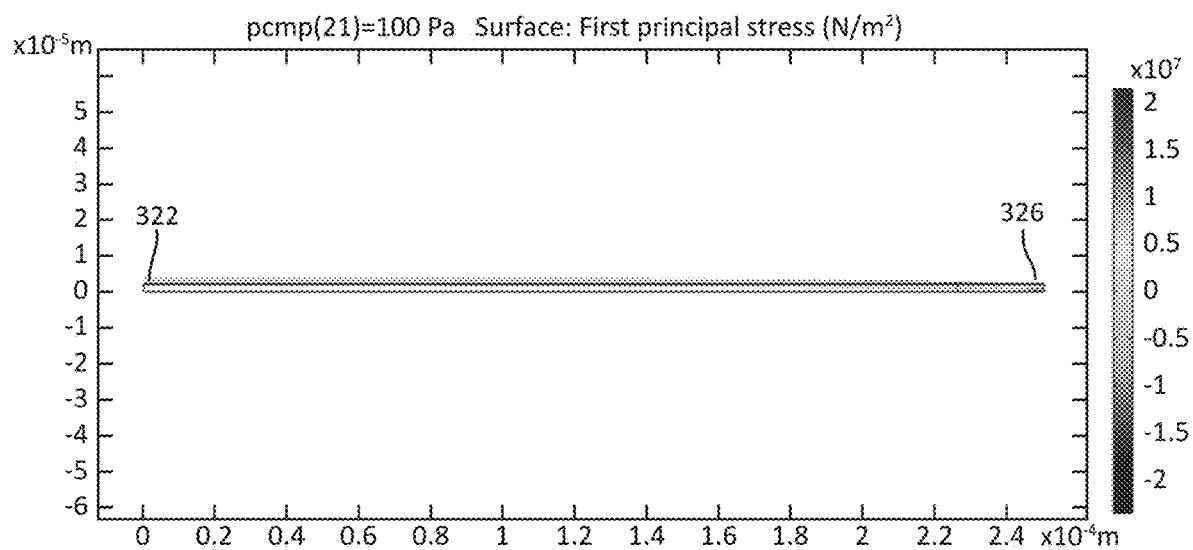
FIG. 15 is a diagram illustrating the stress and deflection of a portion of the diaphragm of FIG. 13 subjected to a distributed according to implementations of the present disclosure.

FIG. 15 illustrates the stresses and deflection in half of the diaphragm 298 resulting from the atmospheric pressure. FIG. 15 illustrates the diaphragm 298 in an inverted orientation with respect to FIG. 13. The non-depicted half of the diaphragm 298 experiences similar stresses and deflection. FIG. 15 illustrates the undeflected diaphragm 298 using wireframe and the deflected bellow structure 298' using shading. As indicated in FIG. 15, the diaphragm 298 experiences the most deflection proximate the center 322 of the diaphragm 298 and the least deflection proximate the end 326 of the diaphragm 298. The bellow structure 298 experiences the least stress proximate the center 322 of the bellow structure 298 and concentrated high stress proximate the end 326 due to reaction forces resulting from deflection of the diaphragm 298 with respect to the bonding material 142.

Figure 16:
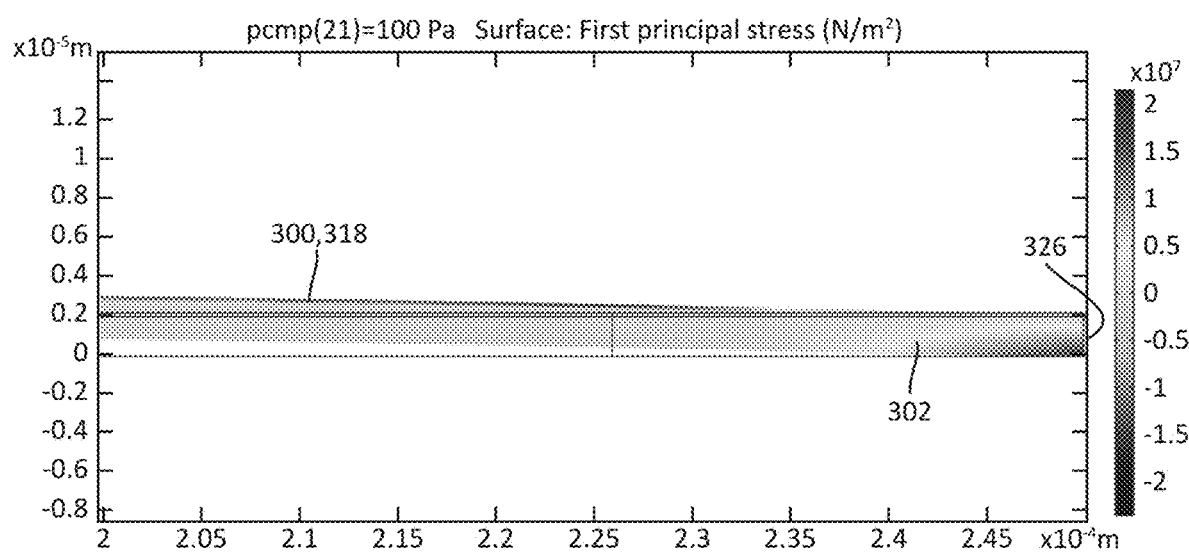
FIG. 16 is a detail view of the diaphragm of FIG. 15.

FIG. 16 illustrates a detail view of a portion of the diaphragm 298 secured to the bonding material 142 illustrating the stresses and deflection of the first layer 300 and the second layer 302 proximate the end 326 of the diaphragm 298 due to stresses resulting from deflection of the diaphragm 298 with respect to the bonding material 142. FIG. 16 illustrates the diaphragm 298 in an inverted orientation with respect to FIG. 13. The first layer 300 experiences relatively low stress (e.g. between approximately 0 and 0.5 GPa) proximate the end 326 and relatively high distributed stress along a portion of the contact wall 318 spaced from the first end 326. In contrast, the second layer 302 experiences relatively high stress (e.g. between approximately 0.7-1.5 GPa) proximate the bonding material secured to the end 326. The relatively high stress exerted on the second layer 302 is a concentrated stress proximate the bonding material 142. Accordingly, the diaphragm 298 is structured to reduce stiffness by exposing the relatively elastic second layer 302 to the concentrated stresses, while exposing the relatively rigid first layer 300 to distributed stresses so that the diaphragm 298 does not get stiff as the diaphragm 298 deflects and contracts under cyclic loading and/or large applied forces caused by large applied pressures, such as the atmospheric pressure.

FIG. 17 illustrates the processing circuit or integrated circuit (IC) 106 of the microphone device 82 according to an implementation of the present disclosure. The IC 106 includes the acoustic processing portion or the acoustic signal detection loop 304 and the atmospheric processing portion or the atmospheric pressure compensation loop 308. The acoustic signal detection loop 304 includes an acoustic sensing capacitor 312, an amplifier 316, an IDAC 320, a sigma delta converter (SDM) 324, a loop filter 328, and a system of back-to-back diodes 332. The acoustic sensing capacitor 312 is positioned in the dielectric comb 98 and engaged with the acoustic sensing portion 110 and for sensing a capacitance of the acoustic sensing portion 110. In the illustrated implementation, the acoustic sensing capacitor 312 has a capacitance of approximately 10 picoFarads (pF).

The amplifier 316 is structured to receive a signal indicative of the capacitance measured across the acoustic sensing capacitor 312. The signal indicative of the capacitance measured across the acoustic sensing capacitor 312 is proportional to the pressure changes (i.e., the changes due to both atmospheric and acoustic pressure). The amplifier 316 is structured to amplify the signal so that the signal is large with respect to noise that can be introduced by the SDM 324 to reduce an effect of any noise introduced by the SDM 324 on the signal. The amplified signal travels to the SDM 324, which converts the analog signal sensed across the acoustic sensing capacitor 312 into a digital signal. A portion of the digital signal then exits the acoustic signal detection loop 304.

The loop filter 328 and the IDAC 320 are structured to process the incoming acoustic signal based on the acoustic signal leaving the SDM 324. A portion of the signal leaving the SDM 324 enters the loop filter 328. In some implementations, the loop filter 328 can be a high pass filer or an amplifier that is structured to remove a low frequency portion of the signal before the signal reaches the amplifier 316, which can remove the portion of the signal that is indicative of changes in the atmospheric pressure and/or can prevent overloading of the amplifier by low frequency sounds such as wind noise. The IDAC 320 can be structured to determine an amplitude of the signal and output a current based on the amplitude of the signal. The current output by the IDAC 320 can be sized to cancel and/or reduce a size of high amplitude signals before the signal enters the amplifier 316. This prevents the amplifier 316 from being overloaded and prevents the acoustic signal detection loop 304 from outputting a high amplitude signal that can damage human hearing.

The portion of the digital signal that exits the acoustic signal detection loop 304 may be stored in a memory (e.g., of the acoustic signal detection loop 304 and/or a memory device in wired or wireless communication with the acoustic signal detection loop 304). The acoustic signals and/or data may also be sent via a wireless or wired connection to a receiving device, such as a speaker. In some implementations, the portion of the digital signal that exits the acoustic signal detection loop 304 needs to be corrected to compensate for non-linearity of the sensing device, variations that occurred during manufacturing, and/or temperature. In such implementations, compensation coefficients for use in the compensation may be stored in a memory of a computing device of the microphone device 82.

With continued reference to FIG. 17, the atmospheric pressure compensation loop 308 includes an atmospheric pressure sensing loop 336, a control loop 340, a charge pump system 102, a back-to-back diode system 348, and a decoupling capacitor 352. The atmospheric pressure sensing loop 336 is structured to output a signal indicative of a change in the atmospheric pressure by modifying a carrier signal generated by a signal generator (not shown) based on the changes in the atmospheric pressure. The control loop 340 is structured to receive the signal indicative of the change in the atmospheric pressure and generate a charge pump control signal based on the change in the atmospheric pressure sensed by the atmospheric pressure sensing loop 336. The charge pump system 102 is structured to provide a biasing charge to the conductors 154A-154D or the conductors 186, 190, 194 to compensate for the change in the atmospheric pressure. The back-to-back diode system 348 and the decoupling capacitor 352 form a low pass filter with a very low roll-off frequency for removing noise generated by the charge pump system 102.

Figure 18:
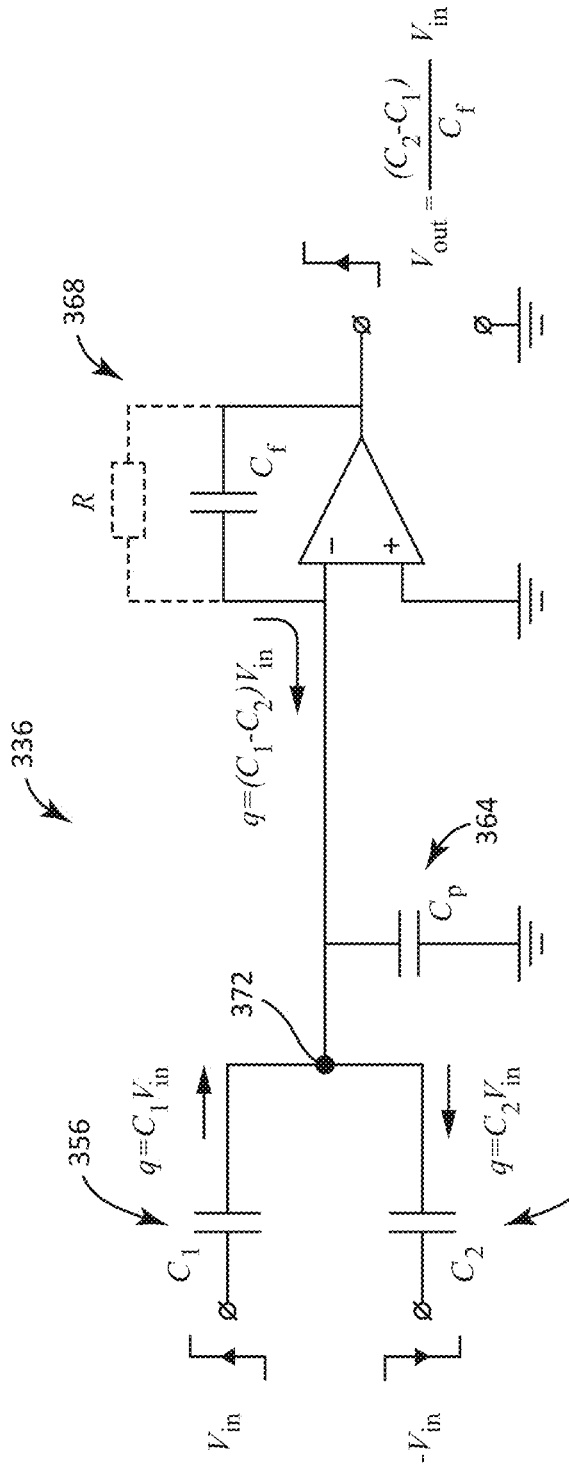
FIG. 18 is a representation of the sensing loop of the control loop of FIG. 17 according to some implementations of the present disclosure.

FIG. 18 illustrates the atmospheric pressure sensing loop 336. The atmospheric pressure sensing loop 336 includes a reference capacitor 356, an atmospheric pressure sensing capacitor 360, a parasitic capacitor 364, a filter 368, and a carrier signal generator (not shown). The carrier signal generator is structured to generate an alternating signal (e.g. waveform signal) including a frequency and an amplitude. The carrier signal has a high frequency relative to the changes in the atmospheric pressure sensed by the atmospheric pressure sensing capacitor 360. In the illustrated implementation, the carrier signal generator is structured to generate a square shaped carrier signal. In other implementations, the carrier signal can have other shapes, such as, for example, a sinusoidal shape. The reference capacitor 356 includes a first lead engaged with a positive terminal of the carrier signal generator and a second lead connected to an output of the charge pump system 102. The capacitance $C_1$ of the reference capacitor 356 is indicative of the charge sent to bias the conductors 154A-154D or the conductors 186, 190, 194 by the charge pump system 102. In the illustrated implementation, the capacitance of $C_1$ is approximately 10 pF. The atmospheric pressure sensing capacitor 360 includes a first lead engaged with a negative terminal of the carrier signal generator and a second lead connected to the pads 156A-156D of the conductors 154A-154D or the conductors 186, 190, 194 of the atmospheric pressure sensing portion 114. The capacitance $C_2$ of the atmospheric pressure sensing capacitor 360 is indicative of the atmospheric pressure exerted on the dielectric comb 98 and can be used as a measure of the absolute atmospheric pressure. In the illustrated implementation, the capacitance $C_2$ is approximately 10 pF. The reference capacitor 356 and the atmospheric pressure sensing capacitor 360 are connected in parallel at a node 372. The amplitude of the carrier signal leaving the node 372 is modified based on a difference between the capacitances sensed by the atmospheric pressure sensing capacitor 360 and the reference capacitor 356 multiplied by the input voltage, as shown by the equation $$q=(C_2-C_1)*V_{in} \qquad (1),$$

where q is the modified carrier signal, $C_2$ is the capacitance across the atmospheric pressure sensing capacitor 360, $C_1$ is the capacitance across the reference capacitor 356, and $V_{in}$ is the carrier signal. The modified carrier signal is then filtered by the filter 368. In the illustrated construction, the filter 368 is an active low pass filter. The filter 368 can be structured to filter out the relatively high frequency portion of the signal indicative of the changes in the acoustic pressure. The filter 368 can generate an output signal according to the equation $$V_{out} = \left(\frac{c_2 - c_1}{c_f}\right)V_{in}, \qquad (2)$$

where $V_{out}$ is the output signal, $C_2$ is the capacitance across the atmospheric pressure sensing capacitor 360, $C_1$ is the capacitance across the reference capacitor 356, $C_f$ is the capacitance of the capacitor of the active low pass filter 368, and $V_{in}$ is the carrier signal. In the illustrated implementation, the capacitance of the capacitor $C_f$ is approximately 1 pF. In the illustrated implementation, a resistance of a resistor R of the active low pass filter is greater than or equal to approximately 8 MΩ. In other implementations, the resistance of the resistor R can be between approximately 10 MΩ and approximately 20 MΩ. Accordingly, a portion of the output signal includes information indicative of the difference between the capacitance across the reference capacitor 356 and the atmospheric pressure sensing capacitor 360 and a portion of the output signal includes the carrier signal. In the illustrated construction, the amplitude of the output voltage is proportional to a difference between the capacitance of the reference capacitor 356 and the atmospheric pressure sensing capacitor 360. Accordingly, when the charge pump system 102 is producing too much current to compensate for the atmospheric pressure, the control signal can be a positive signal. When the charge pump is producing too little current to compensate for the atmospheric pressure, the charge output voltage can be a negative voltage. The output voltage is zero when the charge pump is outputting a voltage that compensates for the force exerted by the atmospheric pressure (e.g. the capacitance of the reference capacitor 356 and the atmospheric pressure sensing capacitor 360 are substantially equal and opposite). The output carrier signal is sent to the control loop 340 to generate a charge pump control signal based on the amplitude of the output signal. The parasitic capacitor 364 is positioned between the node 372 and the active low pass filter 368 and absorbs capacitances that may occur in the atmospheric pressure sensing loop 336 that are not related to the capacitance of the reference capacitor 356 and/or the atmospheric pressure sensing capacitor 360, which reduces noise in the atmospheric pressure sensing loop 336. In other embodiments, the reference capacitor 356 can be engaged with the negative terminal of the carrier signal generator and the atmospheric pressure sensing capacitor 360 can be engaged with the positive terminal of the carrier signal generator. In such an implementation, the control signals sent to the charge pump system 102 are the opposite of the controls signals described above.

Figure 19:
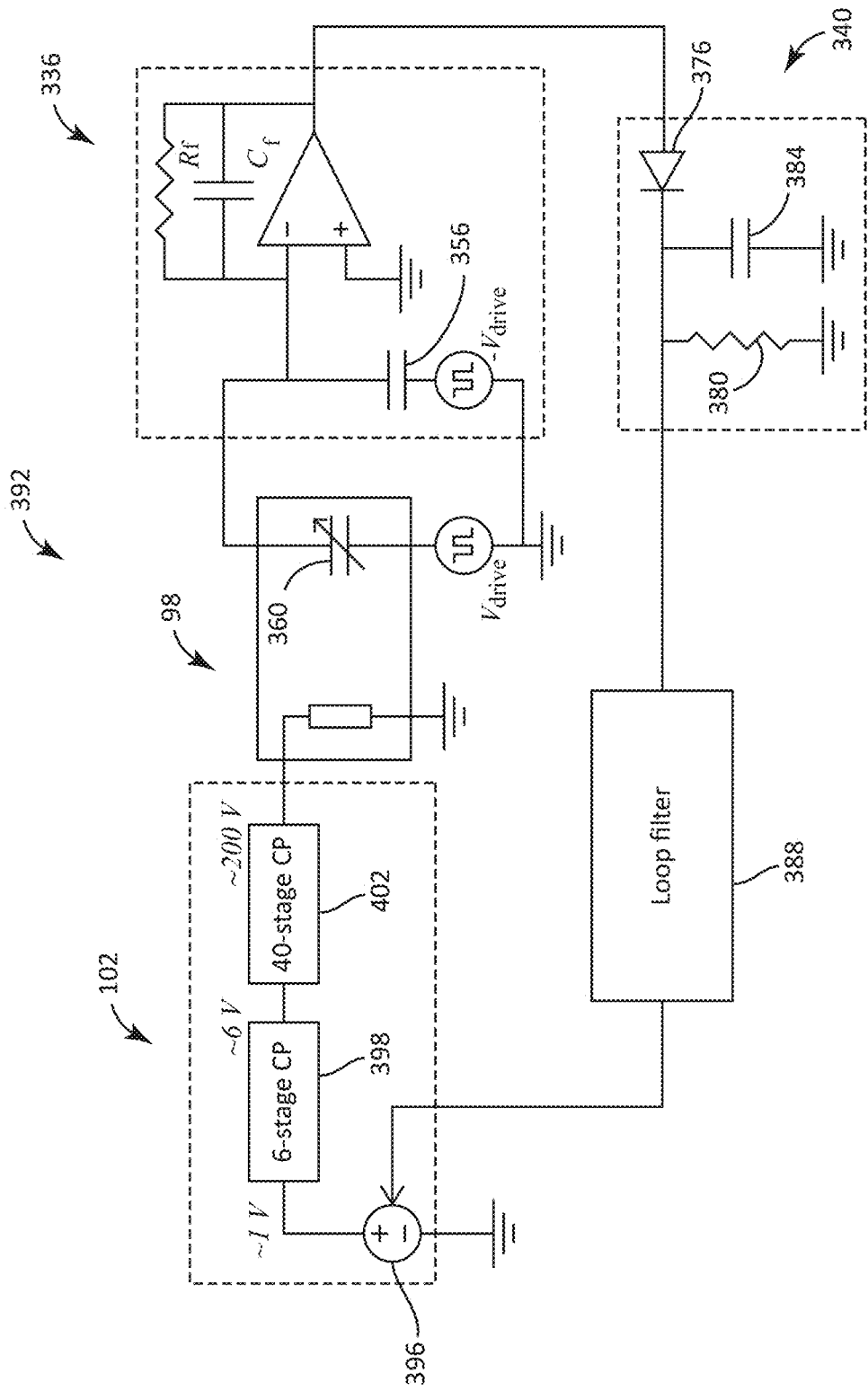
FIG. 19 is a representation of an analog control system of the microphone of FIG. 3 and/or FIG. 13 including a dielectric comb according to implementations of the present disclosure.

As shown in FIG. 19, in the illustrated implementation, the control loop 340 is a demodulator circuit including a diode 376, a resistor 380, and a capacitor 384. The control loop 340 is structured to generate a charge pump control signal based on the output signal generated by the atmospheric pressure sensing loop 336. More specifically, in the illustrated implementation, the control loop 340 is structured to remove the carrier signal (e.g., the high frequency portion) from the output signal. The output signal travels from the atmospheric pressure sensing loop 336 to the diode 376. The diode 376 allows one of the positive or the negative portions of the output signal to pass. The output signal then passes to the capacitor 384, which filters out the relatively high frequency carrier signal to generate the charge pump control signal. The charge pump control signal commands the charge pump system 102 to increase or decrease a charge sent to bias the conductors 154A-154D or the conductors 186, 190, 194. Although the control loop 340 of the illustrated implementation is an analog circuit, in other implementations, the control loop 340 can be a digital circuit or include both digital and analog components.

In some implementations, the dielectric comb may have an operating position (e.g. position of the conductors 154A-154D or the conductors 186, 190, 194 relative to the dielectric bars 178, 172) defined by a target capacitance measured across the atmospheric pressure sensing capacitor 360 and/or the acoustic sensing capacitor 312. In such implementations, the control loop 340 may be structured to generate a charge pump control signal to generate a target capacitance across the atmospheric pressure sensing capacitor 360 and/or the acoustic sensing capacitor 312. Accordingly, in such implementations, charge pump control signal can be sized so that the capacitance across the atmospheric sensing capacitor 360 and/or the acoustic sensing capacitor 312 is approximately the target capacitance when the microphone device 82 is used at atmospheric pressures ranging between approximately 20 kPa (e.g., at the top of Mount Everest) and approximately 100 kPa (e.g., at sea level). In some implementations, a loop filter 388 is positioned between the control loop 340 and the charge pump system 102. The loop filter 388 is structured to set the time constant for the loop and ensure the stability of the loop. The output of the loop filter is the control signal to set the reference voltage to the charge pump.

FIG. 19 illustrates an exemplary schematic representation of an analog control system 392 for the microphone device 82 according to some implementations. The analog control system 392 includes the dielectric comb 98, the atmospheric pressure sensing loop 336, the loop filter 388, and the charge pump system 102. In the illustrated implementation, the charge pump system 102 is a two-stage charge pump system and includes a voltage source 396 (such as a battery), a first stage 398, and a second stage 402. The voltage source 396 is controlled based on the control signal generated by the control loop 340 and/or the loop filter 388. The first stage 398 delivers a charge based on the control signal sent by the control loop 340. The second stage 402 is arranged in series with the first stage 398 and is structured to amplify the charge sent by the first stage 398. In the illustrated implementation, the voltage source generates a voltage of approximately 1V. The first stage 398 is a 6 stage charge pump and generates approximately 6V. The second stage 402 is a 40 stage charge pump and generates approximately 200V. In other implementations, the voltage source 396, the first stage 398 and the second stage 402 may generate different voltages. In other implementations, the first stage 398 and/or the second stage 402 may include more or fewer stages.

In response to the capacitance sensed by the atmospheric pressure sensing capacitor 360, the atmospheric pressure compensation loop 308 may change the bias voltage sent to the conductors 186, 190, 194 until the capacitance sensed by the atmospheric pressure sensing capacitor 360 reaches a predetermined value or until the difference between the capacitance sensed by the atmospheric pressure sensing capacitor 360 and the capacitance sensed by the reference capacitor 356 reaches a predetermined value. In some implementations, the predetermined value is approximately zero. In the illustrated implementation, the bias voltage applied to the conductors 186, 194 can range between 100 V and 200 V. In some implementations, the designs disclosed herein may provide for sensing of changes in ambient pressure of up to approximately 100 pascals per second (Pa/sec). Changes in ambient pressure of approximately 100 Pa/sec occur on very fast elevators, such as the elevator of the Shanghai tower, and are faster than pressure changes that occur on commercial airplanes. The charge pump system 102 is designed to alter the voltage applied to the conductors 186, 194 by approximately 100 mV per second.

Since the microphone device 82 is used at atmospheric pressure, the electrostatic force $F_E$ must only be adjusted to compensate for changes in the atmospheric pressure to reduce noise in the acoustic pressure sensed by the acoustic sensing portion 110. The changes in the atmospheric pressure range are slower than changes in an acoustic pressure range. For example, atmospheric pressure changes occur at frequencies of approximately 10 Hz and pressure changes in the acoustic pressure range are between approximately 20 Hz-20 kHz. In some implementations, the atmospheric pressure sensing capacitor 360 is sized so that the atmospheric pressure sensing capacitor 360 does not respond in the acoustic frequency range, but does respond in the range of changes in the atmospheric pressure. Accordingly, the charge pump system 102 should change the charge of the conductors 186, 190, 194 of the atmospheric pressure sensing portion 114 in response to the changes in the atmospheric pressure sensed by the charge pump system 102, but should not follow the pressure changes in the acoustic frequency range sensed by the acoustic sensing portion 110.

Figure 20:
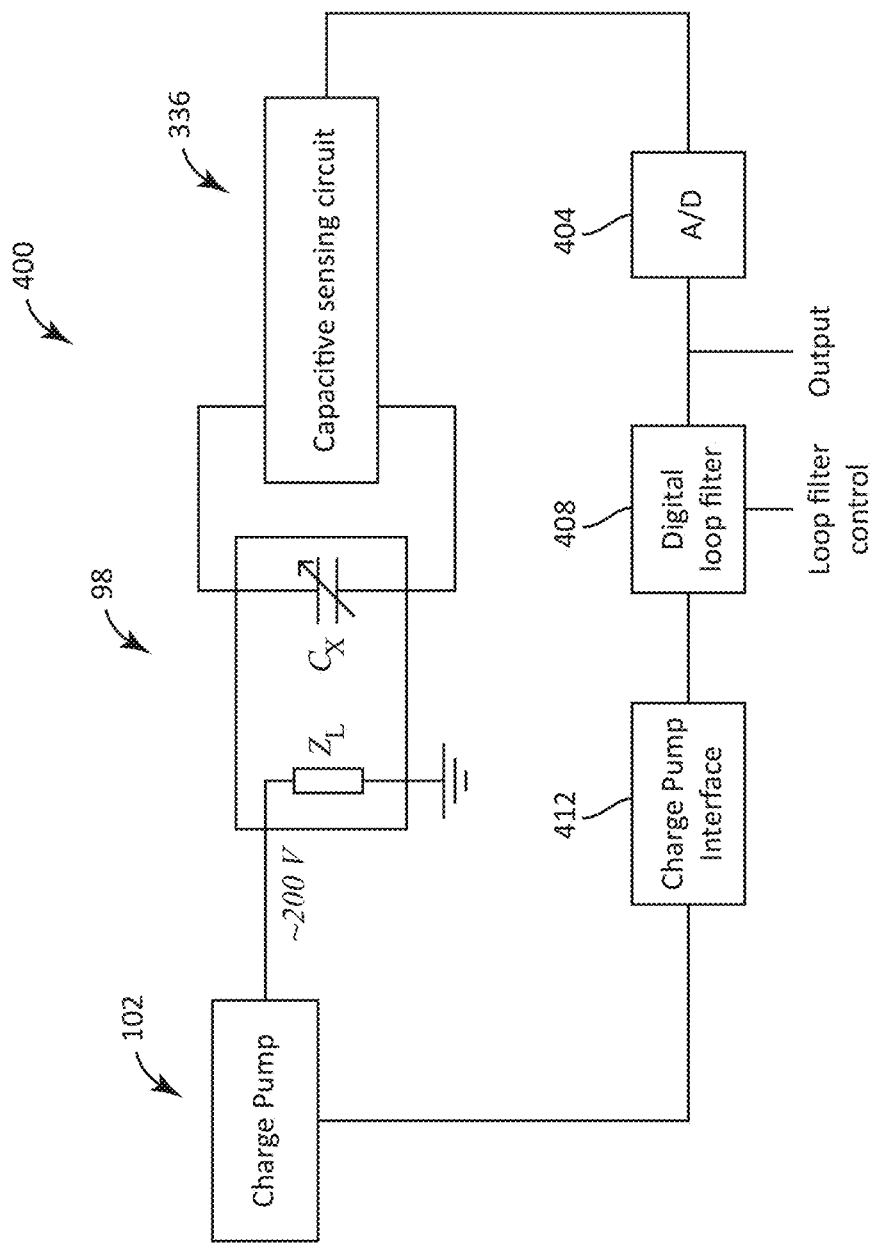
FIG. 20 is a representation of a control system including both digital and analog components of the microphone of FIG. 3 and/or FIG. 13 including a dielectric comb according to implementations of the present disclosure.

FIG. 20 illustrates an exemplary schematic representation of a digital control system 400 for the microphone device 82 according to some implementations. The digital control system 400 is similar to the analog control system 392, but is structured to convert at least part of the signals to the digital domain. For example, as illustrated in FIG. 19, the digital control system includes an analog-to-digital (A/D) converter 404 for converting the acoustic signal and/or the charge pump control signal generated by the control loop 340 into a digital signal. Furthermore, the implementation of FIG. 19 contemplates the use of a digital loop filter 408 to generate a control signal for the charge pump system 102 and a digital charge pump interface 412 for controlling the charge pump system 102 based on the digital signal.

Figure 21:
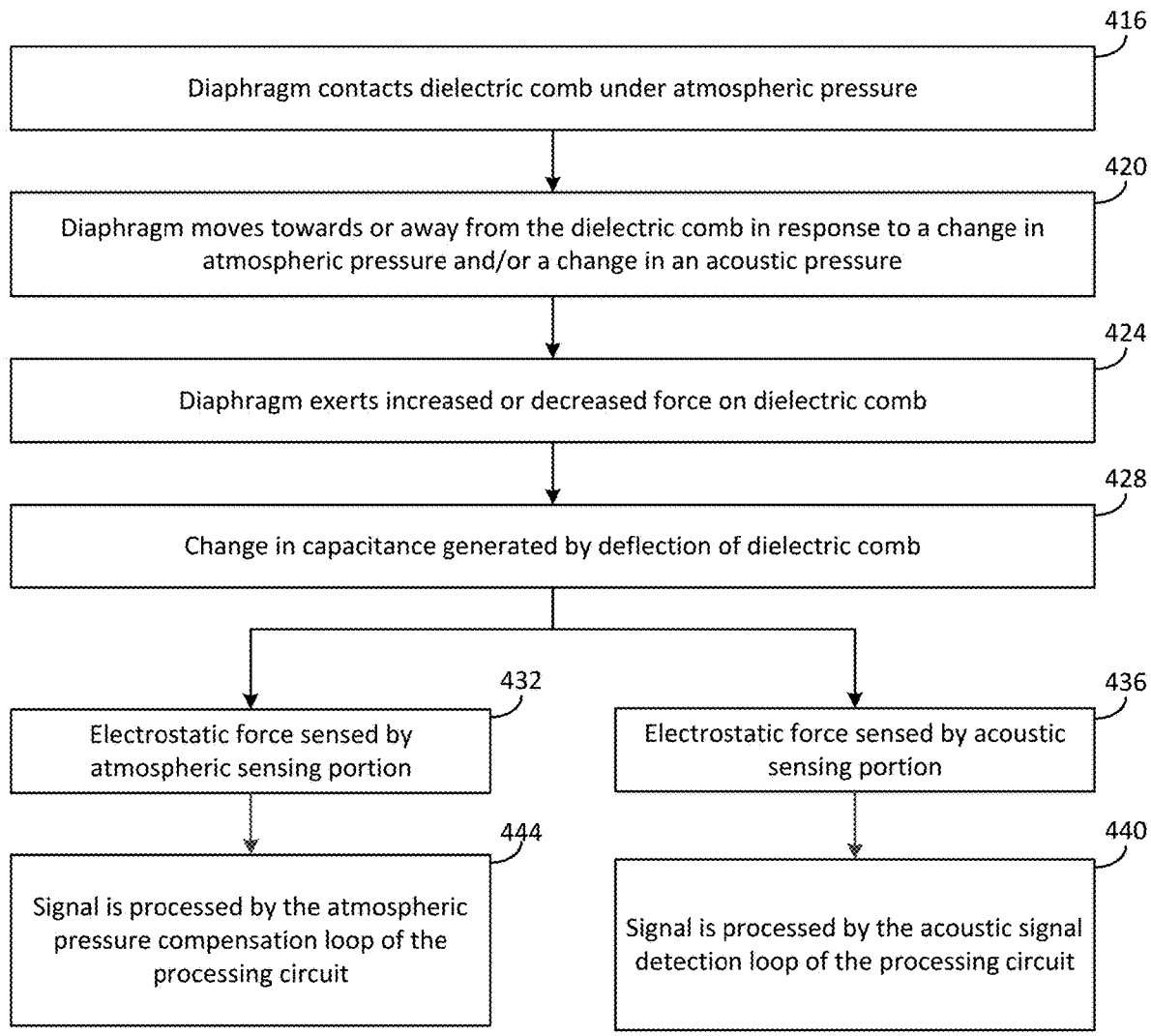
FIG. 21 is a flowchart illustrating an operating process of the microphone system of FIG. 3 and/or FIG. 13 according to implementations of the present disclosure.

FIG. 21 illustrates an exemplary operating process of the microphone device 82. The bellow structure described in this exemplary operating process can be either the bellow diaphragm 94 (FIGS. 3, 11-12) or the diaphragm 298 (FIGS. 13-16). After manufacturing, the diaphragm extends into the second cavity 146 proximate the dielectric comb 98. When exposed to atmospheric pressure conditions, the force due to the atmospheric pressure causes the diaphragm to extend so that the fourth bellow plate 278 or the contact wall 318 contacts the dielectric comb 98 (416). Fluctuations in the atmospheric pressure and/or acoustic pressure can cause the diaphragm to move toward or away from the dielectric comb 98 (420). As the diaphragm moves within the second cavity 146, the diaphragm exerts a distributed force on the dielectric comb 98 as is shown in FIG. 12 (424). For example, when the diaphragm moves downward, the diaphragm exerts an increased force on the dielectric comb 98. When the diaphragm moves upward, the diaphragm exerts a reduced pressure on the dielectric comb 98. The change in the distributed force exerted on the dielectric comb 98 causes the conductors 186, 190, 194 of the dielectric comb 98 to deflect with respect to the dielectric bars 178, 182, causing a change in the capacitance of the dielectric comb 98 (428). Deflection due to fluctuations in the atmospheric pressure can cause an electrostatic force sensed by the atmospheric pressure sensing portion 114 of the dielectric comb (432). More specifically, the change in capacitance across the conductors 154A, 154B of the acoustic sensing portion 110 is sensed by the acoustic sensing capacitor 312, which is hardwired to the atmospheric pressure compensation loop 308. In some implementations, the electrostatic force changes at a frequency of approximately 10 Hz. Acoustic pressures occurring proximate the microphone device 82 exert an acoustic force on the bellow structure, causing the bellow structure to move within the second cavity 146, causing an electrostatic force sensed by the acoustic sensing portion 110 (436). More specifically, the change in capacitance across the conductors 154A, 154B of the acoustic sensing portion 110 is sensed by the acoustic sensing capacitor 312, which is hardwired to the acoustic signal detection loop 304. In some implementations, the electrostatic force changes at a frequency ranging between approximately 20 Hz and 20 kHz. When atmospheric pressure changes and acoustic pressure changes occur simultaneously, a change in capacitance indicative of the total change in pressure is sent to the atmospheric pressure compensation loop 308 by the atmospheric pressure sensing portion 114 and is sent to the acoustic sensing portion 110 by the acoustic sensing portion 110. The total signal sent to the acoustic signal detection loop 304 of the IC 106 is processed to remove the portion of the total signal that is indicative of the change in atmospheric pressure and to generate an audio output signal (440). The total signal sent to the atmospheric pressure compensation loop 308 is processed to remove the portion of the total signal that is indicative of the change in acoustic pressure. The atmospheric pressure compensation loop 308 then generates a control signal for modifying the biasing current sent by the charge pump to the biasing capacitors in response to the change in the atmospheric pressure (444).

Figure 22:
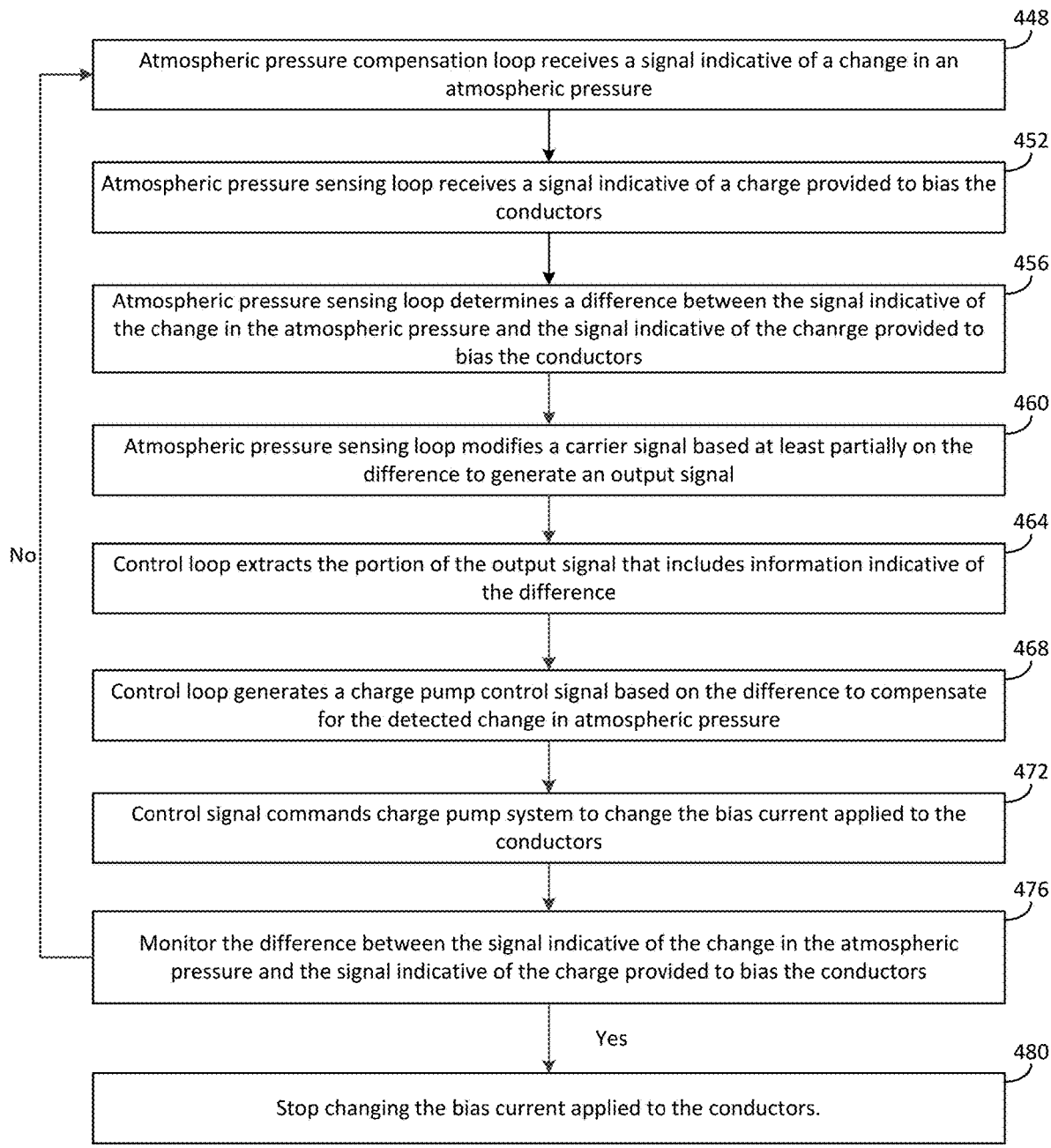
FIG. 22 is a flowchart illustrating a feedback response process of the microphone system of FIG. 3 and/or FIG. 13 according to implementations of the present disclosure.

FIG. 22 illustrates a feedback response of the atmospheric pressure compensation loop 308 according to some implementations. The atmospheric pressure sensing loop 336 receives a signal indicative of a change in the atmospheric pressure (448). The atmospheric pressure sensing loop 336 further receives a signal indicative of a charge provided to bias the conductors 154A-154D or the conductors 186, 190, 194 by the charge pump system 102 (452). The atmospheric pressure sensing loop 336 then determines a difference between the signal indicative of the change in the atmospheric pressure and the signal indicative of the charge provided to bias the conductors 154A-154D or the conductors 186, 190, 194 (456). The atmospheric pressure sensing loop 336 modifies a carrier signal based at least partially on the difference to generate an output signal (460). The control loop 340 then extracts the portion of the output signal that includes information indicative of the difference (464). The control loop 340 then generates a charge pump control signal based on the difference to compensate for the detected change in atmospheric pressure (468). The control signal is indicative of a biasing current to be applied to the conductors 154A-154D or the conductors 186, 190, 194 for counteracting the effect of the change in atmospheric pressure on the dielectric comb 98. For example, in response to determining that the atmospheric pressure has decreased, the atmospheric pressure compensation loop 308 may determine that the biasing current sent to the conductors 186, 194 should be reduced. In response to determining that the atmospheric pressure has increased, the atmospheric pressure compensation loop 308 may determine that the biasing current sent to the conductors 186, 194 should be increased. In some embodiments, the control signal may be further processed by the loop filter 388. The control signal then travels to the charge pump system 102 and commands the charge pump system 102 to change the bias current applied to the conductors 154A-154D or 186, 190, 194 (472). In some implementations, the atmospheric pressure compensation loop 308 monitors the difference between the signal indicative of the atmospheric pressure (e.g., the capacitance sensed by the atmospheric pressure sensing capacitor 360) and the signal indicative of the charge provided to bias the conductors (e.g., the capacitance sensed by the reference capacitor 356) (476). When the difference is low, the bias provided by the charge pump is adequately compensating for the atmospheric pressure. Accordingly, the control signal is not significantly modified (e.g., the $C_1$-$C_2$ terms in equations (1) and (2) is low or zero). A large difference indicates that the bias charge provided by the charge pump is too high or too low to compensate for the atmospheric pressure. In response to the difference being high, the control circuit increases or decreases the control signal so that the bias charge is modified in response to the change in atmospheric pressure. The modification of the bias charge stops when the difference reaches and/or falls below the predetermined threshold, which indicates that the bias current applied to the conductors 154A-154D or the conductors 186, 190, 194 is adequately compensating for the atmospheric pressure (480). In response to receiving further information indicative of a change in the atmospheric pressure (e.g. due to changes in the atmospheric pressure and/or over/under correction for the first change in the atmospheric pressure), the atmospheric pressure sensing portion 114 may repeat processes 366-476.

By way of example, in some implementations the microphone device 82 may be exposed to operating conditions in which the atmospheric pressure is changing rapidly while the microphone device 82 is simultaneously receiving an acoustic signal. In an extreme example, the microphone device 82 may be in use on an elevator ascending from ground level to the top of the Shanghai Tower. For example, a person may be speaking into the microphone device 82 while riding the elevator of the Shanghai Tower. The elevator of the Shanghai Tower can travel from the bottom floor to the 95th floor in approximately 45 seconds, carrying passengers at a speed of nearly 46 miles per hour. Accordingly, as the elevator climbs, the diaphragm 90, 298 deflects upward and downward in response to the changes in atmospheric pressure and the changes in acoustic pressure, exerting forces on the dielectric comb 98. at slow frequencies of up to approximately 10 Hz in response to the changes in atmospheric pressure and simultaneously at faster acoustic frequencies of approximately 20 Hz to 200 KHz. Accordingly, the atmospheric pressure sensing loop 336 senses the slower changes in frequency and undergoes the method of FIG. 22 simultaneously with the acoustic signal detection loop 304 processing the acoustic signal.

Figure 23:
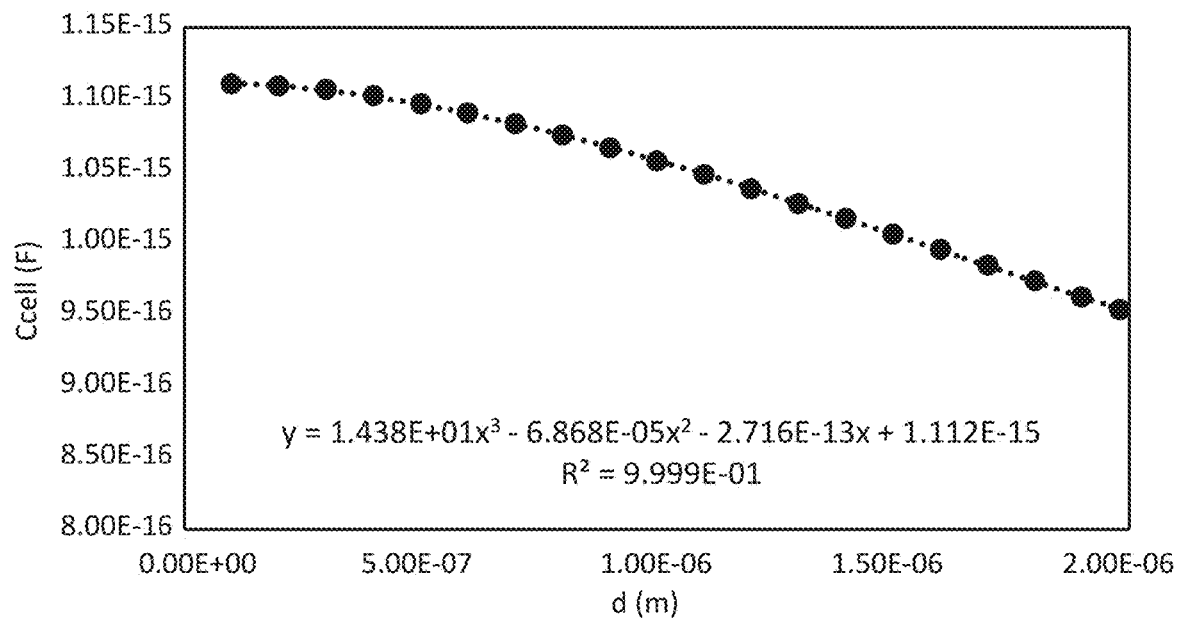
FIG. 23 is a plot of the displacement of a dielectric comb as a result of an acoustic force versus the capacitance of the dielectric comb according to some implementations of the present disclosure.

FIG. 23 illustrates a plot of the capacitance of the dielectric comb 98 vs. a deflection distance according to an implementation of the present disclosure. A wall angle (e.g., an angle of the conductors 186, 190, 194 relative to the vertical) is 0 degrees for the plot shown in FIG. 23. The electrostatic force $F_E$ is linearly dependent on the overlap area between the conductors 186, 190, 194 and the adjacent dielectric bars 178, 182.

Figure 24:
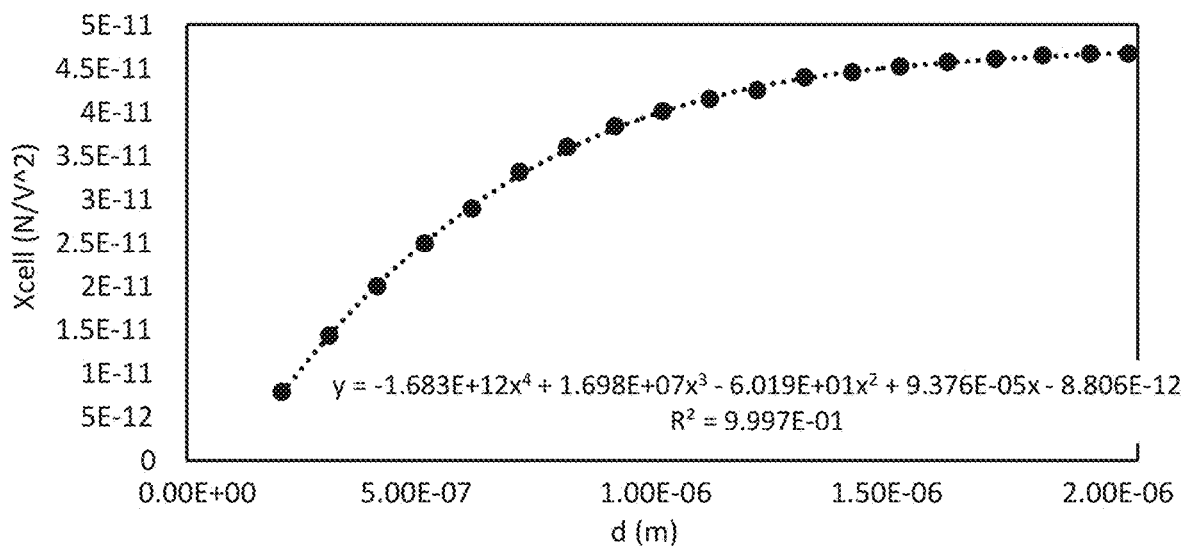
FIG. 24 is a plot of the derivative of the displacement of a dielectric comb as a result of an acoustic force versus the derivative of the capacitance of the dielectric comb according to some implementations of the present disclosure.

FIG. 24 illustrates a derivative of the plot of FIG. 23. As shown in FIG. 24, the rate of change of the capacitance is generally linear for deflections of the dielectric comb 98 ranging between approximately 1.5 μm and approximately 2.0 μm. Accordingly, it is possible to simultaneously slowly vary the bias of the conductors 186, 194 of the atmospheric pressure sensing portion 114 to compensate for the force due to the atmospheric pressure while concurrently sensing acoustic forces caused by acoustic pressure with the acoustic sensing portion 110.

Figure 25:
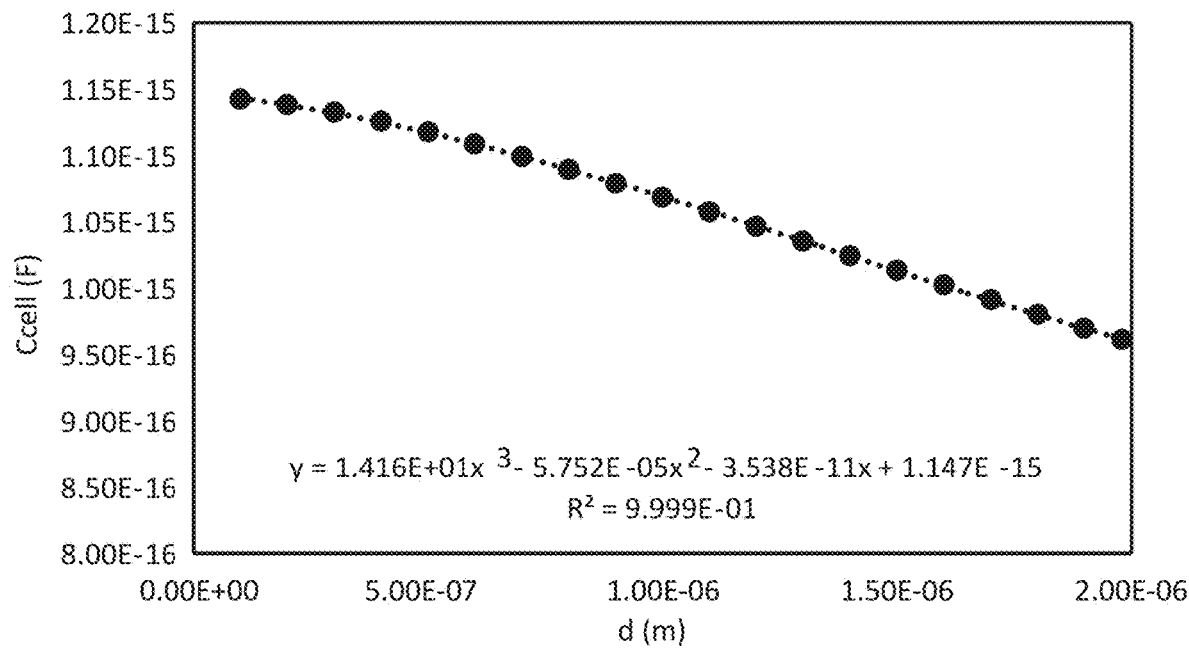
FIG. 25 is a plot of the displacement of a dielectric comb as a result of an acoustic force versus the capacitance of the dielectric comb according to some implementations of the present disclosure.

FIG. 25 illustrates a plot of the capacitance of the dielectric comb 98 v.s. a deflection distance according to an implementation of the present disclosure. A wall angle is 1 degree for the plot shown in FIG. 25.

Figure 26:
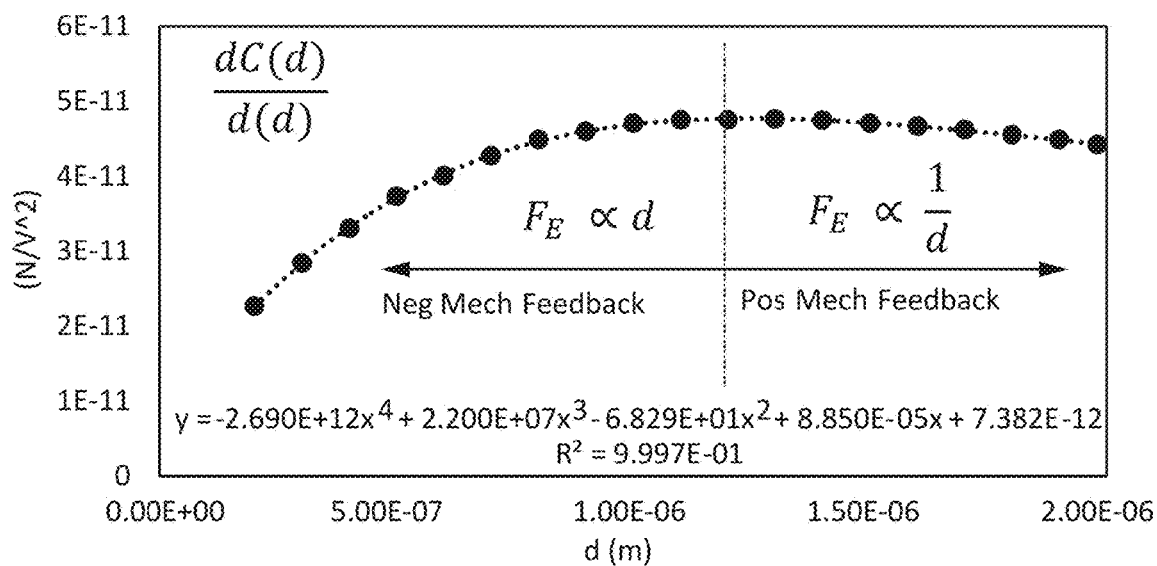
FIG. 26 is a plot of the derivative of the displacement of a dielectric comb as a result of an acoustic force versus the derivative of the capacitance of the dielectric comb according to some implementations of the present disclosure.

FIG. 26 illustrates a derivative of the plot of FIG. 26. As shown in FIG. 25, the rate of change of the capacitance is generally increasing for deflections between approximately 0.25 μm and approximately 1.25 μm. The electrostatic force is generally proportional to the deflection for deflections between approximately 0.25 μm and approximately 1.25 μm, so negative mechanical feedback is sent to the atmospheric pressure compensation loop 308 of the IC 106. The rate of change of the capacitance is decreasing for deflections between approximately 1.25 μm and 2 μm. The electrostatic force is generally proportional to the reciprocal of deflection for deflections between approximately 0.25 μm and approximately 1.25 μm, so positive mechanical feedback is sent to the atmospheric pressure compensation loop 308 of the IC 106.

Figure 27:
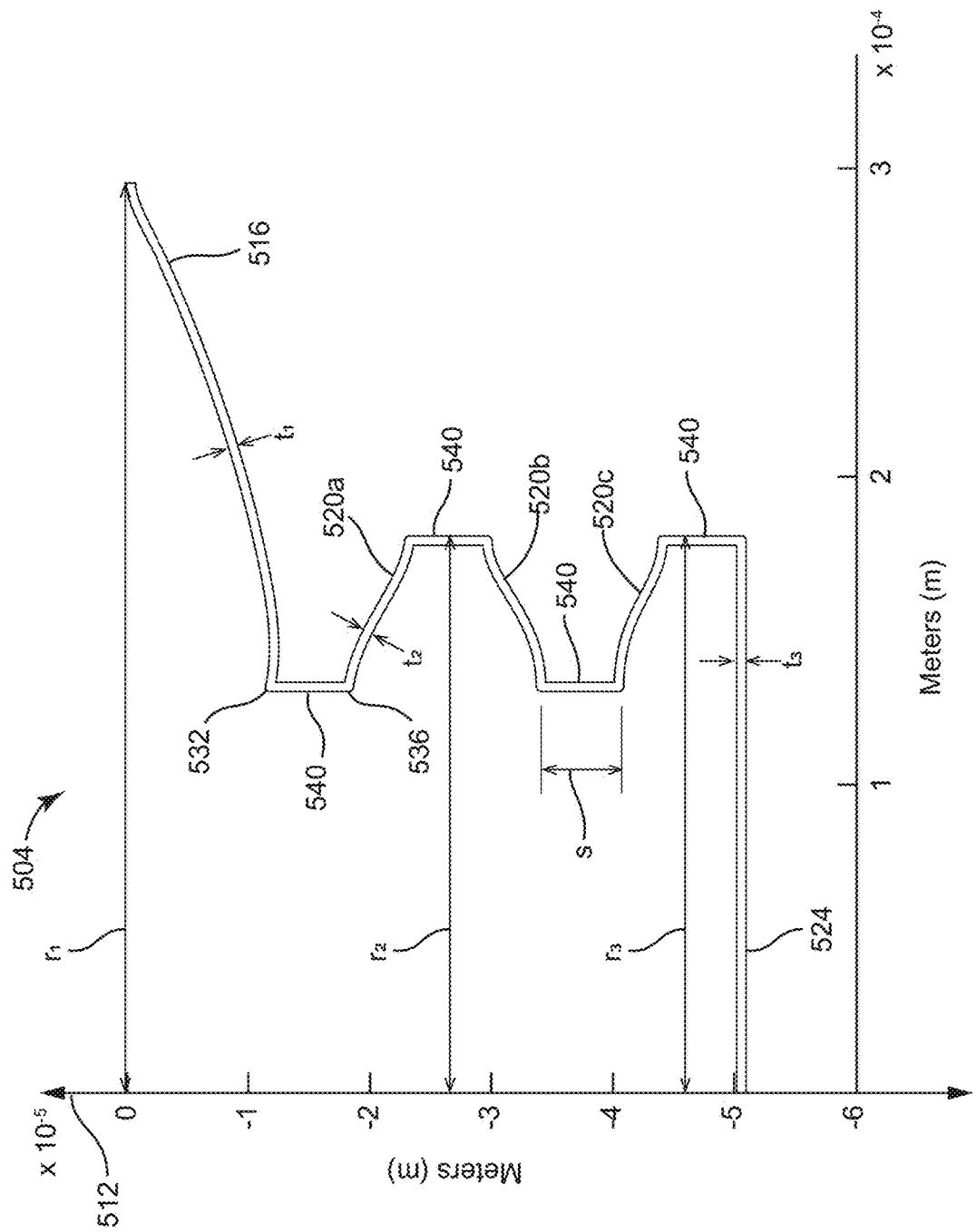
FIG. 27 is a cross-sectional view of a bellow diaphragm subjected to a distributed force exerted by an atmospheric pressure according to some implements of the present disclosure.
Figure 28:
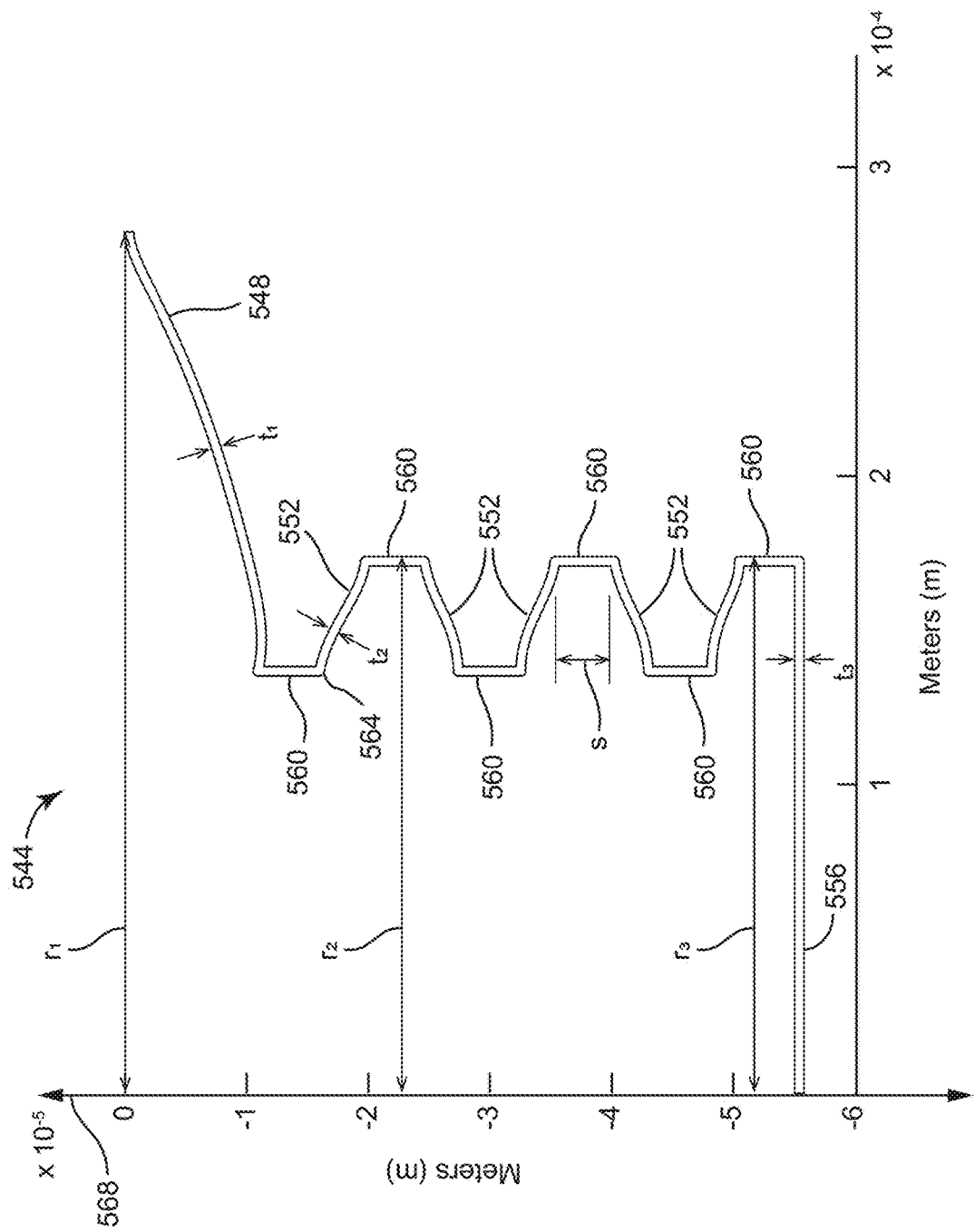
FIG. 28 is a cross-sectional view of a bellow diaphragm subjected to a distributed force exerted by an atmospheric pressure according to some implements of the present disclosure.
Figure 29:
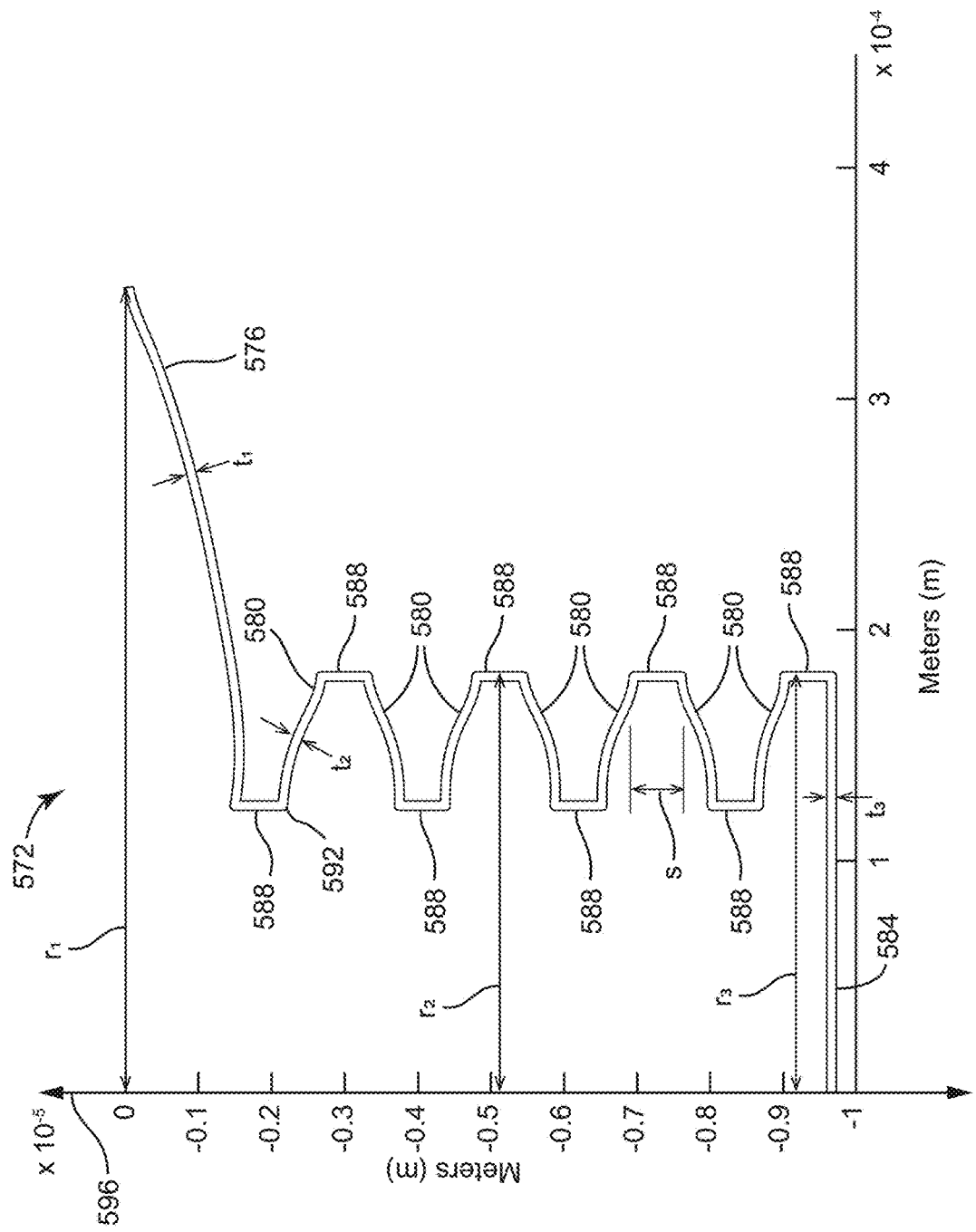
FIG. 29 is a cross-sectional view of a bellow diaphragm subjected to a distributed force exerted by an atmospheric pressure according to some implements of the present disclosure.

FIGS. 27-29 show embodiments of bellow diaphragms that can be used with the microphone device 82 that includes the dielectric comb 98. The bellow diaphragms illustrated in FIGS. 27-29 can be integrated with the microphone device 82 substantially similar to what is shown and described with respect to the bellow diaphragm 94. The bellow diaphragm illustrated in FIGS. 27-29 can function substantially similar to what is shown and described with respect to the bellow diaphragm 94.

FIGS. 27-29 are cross-sectional detail views of implementations of a bellow diaphragm 504. The bellow diaphragm 504 is structured to deflect (e.g., upward or downward) in response to an external applied force, thereby exerting an increased force on a dielectric comb, such as the dielectric comb 98 shown and described herein. As shown in FIG. 3 and described relative to the bellow diaphragm 94, the bellow diaphragm 504 is secured to the front surface of the substrate to form a barrier between the atmospheric pressure of the environment of the microphone device 82 and the vacuum of the first cavity 126 and the second cavity 146.

FIG. 27 illustrates a cross-sectional view of half of the bellow diaphragm 504 in the extended position in which the bellow diaphragm 504 is displaced due to an external applied force, such as a force due to an atmospheric pressure and/or an acoustic pressure. The bellow diaphragm 504 is both slanted and elastically deformed due to the external applied force. Exemplary dimensions for the bellow diaphragm 504 are shown on FIG. 27 and described below. Although FIG. 27 is in the extended position, the dimensions described below are for the bellow diaphragm 504 in an undeflected position (e.g., when bellow diaphragm 504 is not subjected to an external applied force). The portion of the bellow diaphragm 504 that is not illustrated in FIG. 27 is substantially symmetric to the illustrated portion of the bellow diaphragm 504 about the axis 512.

The bellow diaphragm 504 includes a first bellow plate 516, a plurality of second bellow plates 520, and a third bellow plate 524. In the implementation of FIG. 27, the plurality of second bellow plates includes three second bellow plates 520. The first bellow plate 516, the second bellow plates 520, and the third bellow plate 524 together form a five-layer MEMS transducer. When viewed from a direction generally normal to the bellow diaphragm 504, the first bellow plate 516 and the second bellow plates 520 have a generally annular structure. When viewed from a direction generally normal to the bellow diaphragm 504, the third bellow plate 524 has a generally circular structure. The first bellow plate 516 has a radius $r_1$ that can be 200 μm through 500 μm. In some implementations, the radius $r_1$ is substantially 200 μm. The first bellow plate 516 has a thickness $t_1$ that can be 0.1 μm through 2 μm. In the illustrated implementation, the thickness $t_1$ is substantially 0.5 μm. The first bellow plate 516 includes a through hole 532 proximate a center of the first bellow plate 516. A perimeter of the one of the second bellow plates 520 is connected to the first bellow plate 516 proximate the through hole 532. Each of the second bellow plates 520 has a radius $r_2$ and a thickness $t_2$ and includes a through hole 536 proximate a center of the second bellow plate 520. The radius $r_2$ is substantially smaller than the radius $r_1$ of the first bellow plate 516. The radius $r_2$ can be 50 μm through 450 μm. In the illustrated implementation, the radius $r_2$ is substantially 200 μm. Although the radii $r_2$ illustrated in FIG. 27 are the same for all of the second bellow plates 520, in other implementations, the radii $r_2$ can be different. The through hole 536 has a radius that can be 30 μm through 440 μm. In the implementation illustrated in FIG. 27, the through hole 536 has a radius of substantially 150 μm. The third bellow plate 524 has a radius $r_3$ and a thickness $t_3$. The radius $r_3$ can be 50 μm through 450 μm. In the illustrated implementation, the radius $r_3$ is substantially 198 μm. Although the radius $r_3$ illustrated in FIG. 27 is different than the radius $r_2$, in other implementations, the radius $r_3$ can be the same as the radius $r_2$. Each of the thicknesses $t_1$, $t_2$, and $t_3$ can be 0.1 μm through 2 μm. In the illustrated implementation, each of the thicknesses $t_1$, $t_2$, and $t_3$ is substantially 0.5 μm.

The bellow plates 516-524 are aligned along the axis 512. The bellow plates 516-524 connected by substantially annular compliant structures 540. The compliant structures 540 facilitate relative deflection between adjacent bellow plates 516-524. The compliant structures 540 between adjacent bellow plates 516-524 are alternately positioned proximate an outer perimeter of the bellow plates 516-524 and proximate the through holes 532, 536. For example, the compliant structures 540 connecting the first bellow plate 516 to a second bellow plate 520a and connecting a second bellow plate 520b to a second bellow plate 520c are positioned proximate the through holes 532, 536. The compliant structure 540 connecting the second bellow plate 520a to the second bellow plate 520b are positioned proximate the outer perimeters of the second bellow plate 520a and the second bellow plate 520b. The compliant structure 540 connecting the second bellow plate 520c to the third bellow plate 524 are positioned proximate the outer perimeters of the second bellow plate 520a and the third bellow plate 524. The positioning of the compliant structures 540 causes the bellow diaphragm 504 to have the substantially zig-zagged cross-sectional configuration illustrated in FIG. 27. In the illustrated implementation, the compliant structures 540 are integrally formed with the bellow plates 516-524. The compliant structures 540 are structured to maintain a spacing s or air gap between adjacent bellow plates 516-524. The spacing s can be between 0.5 μm and 5 μm. In the illustrated implementation, the spacing s is substantially 3 μm.

The bellow plates 516-524 and the compliant structures 540 are made of a material that does not get stiff as the bellow diaphragm 504 undergoes cyclic loading in response to and/or while subjected to large applied forces caused by large applied pressures, such as the atmospheric pressure. A compliance of the bellow diaphragm 504 can be larger than a distance between the third bellow plate 524 and the dielectric comb. In the illustrated implementation, the bellow diaphragm 504 is made of a material that can take a load under substantially atmospheric pressure and maintain a compliance of substantially 1 nm/Pa thorough substantially 10 nm/Pa. In the illustrated implementation, the bellow plates 516-524 and the compliant structures 540 are made of a polysilicon material or a silicon nitride material. Exemplary polysilicon materials include silicon nitrides or silicon oxides. A fundamental resonance of the bellow diaphragm 504 illustrated in FIG. 27 is higher than 20 kHz for 3 decibel (dB) sounds.

FIG. 28 illustrates a cross-sectional view of half of a bellow diaphragm 544 in the extended position according to another implementation of the present disclosure. The bellow diaphragm 544 includes a first bellow plate 548, a plurality of second bellow plates 552, a third bellow plate 556, and a plurality of compliant structures 560. The first bellow plate 548, the third bellow plate 556, and the compliant structures 560 are substantially similar to the first bellow plate 516, the third bellow plate 524, and the compliant structures 540 described above with respect to FIG. 27 and are not described in detail.

As illustrated in FIG. 28, the plurality of second bellow plates 552 includes five second bellow plates 552. The first bellow plate 548, the second bellow plates 552, and the third bellow plate 556 form a seven-layer MEMS transducer. When viewed from a direction substantially normal to the bellow diaphragm 544, the second bellow plates 556 have a generally annular structure. Each of the second bellow plates 556 has a radius $r_2$ and a thickness $t_2$ and includes a through hole 564 proximate a center of the second bellow plate 556. The radii $r_2$ can be 50 μm through 450 μm. In the illustrated implementation, radius $r_2$ is substantially 200 μm. In some embodiments, the each of radii $r_2$ are the same. In other implementations, the radii $r_2$ can be different. The bellow plates 548-556 are aligned along an axis 568. The bellow plates 548-556 are connected by the plurality of substantially annular compliant structures 560. The compliant structures 560 between adjacent bellow plates 548-556 are alternately positioned proximate an outer perimeter of the bellow plates 548-552 and proximate the through holes of the bellow plates 548-552. The positioning of the compliant structures 560 causes the bellow diaphragm 544 to have the substantially zig-zagged cross-sectional configuration illustrated in FIG. 28. In the illustrated implementation, the compliant structures 560 are integrally formed with the bellow plates 548-556. The compliant structures 560 are structured to maintain a spacing s or air gap between adjacent bellow plates. The spacing s can be between 0.5 μm and 5 μm. In the illustrated implementation, the spacing s is substantially 3 μm.

A fundamental resonance of the bellow diaphragm 544 is higher than 20 kHz for 3 decibel (dB) sounds. The seven-layer bellow diaphragm 544 is longer than the five-layer bellow diaphragm 504 illustrated in FIG. 27. Accordingly, a sensitivity of the seven-layer bellow diaphragm 544 is higher than a sensitivity of the five-layer bellow diaphragm 504 because the seven-layer bellow diaphragm 544 can deflect more in a direction of the axis 568 than the five-layer bellow diaphragm 504 can deflect in the direction of the axis 512. The fundamental resonance of the seven-layer bellow diaphragm 544 is lower than the resonant frequency of the five-layer bellow diaphragm 504.

FIG. 29 illustrates a cross-sectional view of half of a bellow diaphragm 572 in the extended position according to another implementation of the present disclosure. The bellow diaphragm 572 includes a first bellow plate 576, a plurality of second bellow plates 580, a third bellow plate 584, and a plurality of compliant structures 588. The first bellow plate 576, the third bellow plate 584, and the compliant structures 588 are substantially similar to the first bellow plate 516, the third bellow plate 524, and the compliant structures 540 described above with respect to FIG. 27 and are not described in detail.

As illustrated in FIG. 29, the plurality of second bellow plates 552 includes seven second bellow plates 580. The first bellow plate 576, the second bellow plates 580, and the third bellow plate 584 form a nine-layer MEMS transducer. When viewed from a direction substantially normal to the bellow diaphragm 572, the second bellow plates 580 have a generally annular structure. Each of the second bellow plates 580 has a radius $r_2$ and a thickness $t_2$ and includes a through hole 592 proximate a center of the second bellow plate 580. The radii $r_2$ can be 50 μm through 450 μm. In the illustrated implementation, radius $r_2$ is substantially 200 μm. In some embodiments, the each of radii $r_2$ are the same. In other implementations, the radii $r_2$ can be different. The bellow plates 576-584 are aligned along an axis 596. The bellow plates 576-584 are connected by the plurality of substantially annular compliant structures 588. The compliant structures 588 between adjacent bellow plates 576-584 are alternately positioned proximate an outer perimeter of the bellow plates 576-580 and proximate the through holes of the bellow plates 576-580. The positioning of the compliant structures 588 causes the bellow diaphragm 572 to have the substantially zig-zagged cross-sectional configuration illustrated in FIG. 29. In the illustrated implementation, the compliant structures 588 are integrally formed with the bellow plates 576-584. The compliant structures 588 are structured to maintain a spacing s or air gap between adjacent bellow plates. The spacing s can be between 0.5 μm and 5 μm. In the illustrated implementation, the spacing s is substantially 3 μm.

A fundamental resonance of the bellow diaphragm 572 illustrated in FIG. 29 is higher than 20 kHz for 3 decibel (dB) sounds. The nine-layer bellow diaphragm 572 illustrated in FIG. 29 is longer than the five-layer bellow diaphragm 504 illustrated in FIG. 27 and the seven-layer bellow diaphragm 544 illustrated in FIG. 28. Accordingly, a sensitivity of the nine-layer bellow diaphragm 572 is higher than the sensitivity of the five-layer bellow diaphragm 504 and the seven-layer bellow diaphragm 544 because the nine-layer bellow diaphragm 572 can deflect more in a direction of the axis 596 than the five-layer bellow diaphragm 504 can deflect in the direction of the axis 512 and the seven-layer bellow diaphragm 544 can deflect in the direction of the axis 596. The fundamental resonance of the bellow diaphragm 572 of FIG. 29 is lower than the fundamental resonance of the five-layer bellow diaphragm 504 and the fundamental resonance of the seven-layer bellow diaphragm 544.

Figure 30:
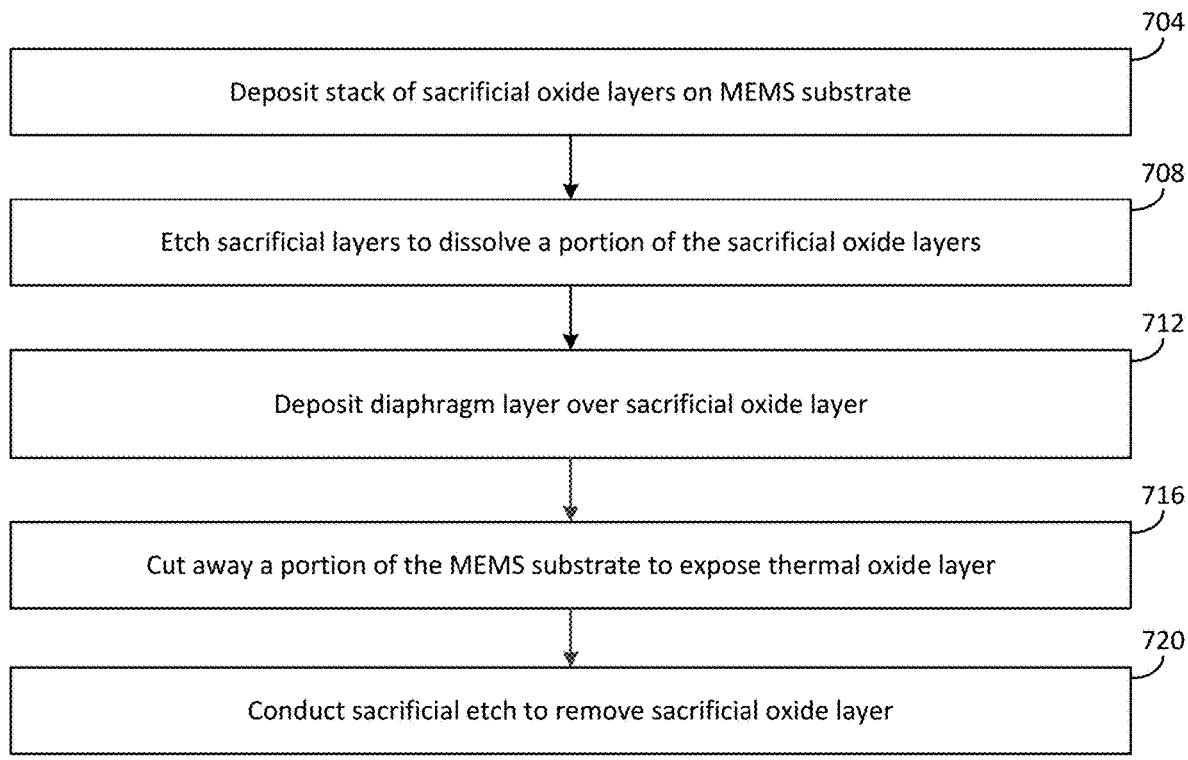
FIG. 30 is a flowchart illustrating the method of manufacturing a bellow diaphragm according to some implementations of the present disclosure.

FIG. 30 is a flowchart that illustrates a manufacturing process for making any of the bellow diaphragms 504, 544, 572. FIGS. 31-35 illustrate steps of the manufacturing process of FIG. 30. In some implementations, the bellow diaphragm 94 can be manufactured in a similar manner.

Figure 31:
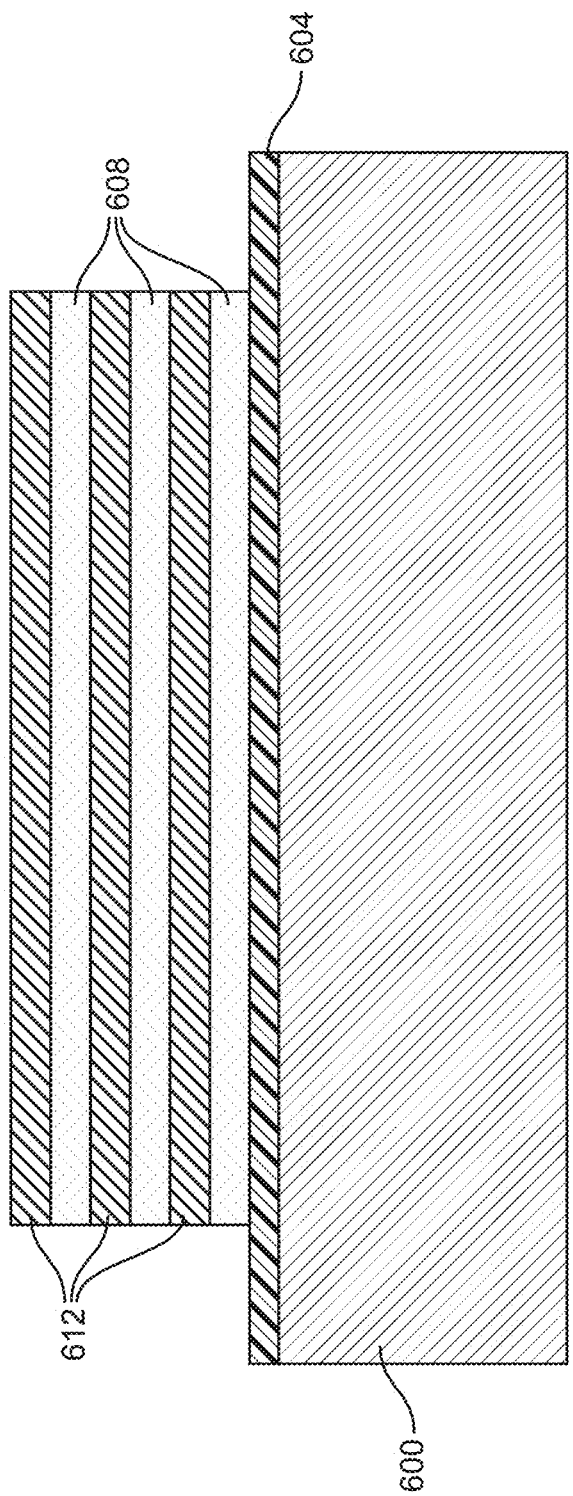
FIG. 31 illustrates a step of the method of FIG. 30 according to some implementations of the present disclosure.

FIG. 31 illustrates a first step 704 of the manufacturing process. During step 704, a stack of sacrificial oxide layers is deposited on a MEMS substrate 600 by chemical vapor deposition (CVD). As illustrated in FIG. 31, a thermal oxide layer 604 is deposited over a first surface of the MEMS substrate 600 having opposed first and second surfaces. In the illustrated embodiment, the thermal oxide layer 604 is silicon dioxide. In other implementations, other types of thermal oxide may be used. Alternating one or more doped oxide layers 608 and undoped oxide layers 612 are deposited over a portion of the thermal oxide layer 604. In the illustrated implementation, three doped oxide layers 608 and three undoped oxide layers 612 are deposited. In other implementations, more or fewer doped oxide layers 608 and undoped oxide layers 612 can be deposited. In the illustrated implementation, the doped oxide is phospho-silicate glass (PSG). The PSG can include 5-20 wt % of phosphorus. In the illustrated embodiment, the PSG includes substantially 10 wt % phosphorous. In the illustrated embodiment, the undoped oxide is undoped silicate glass. In other implementations, different undoped oxides can be used. The thermal oxide layer 604, the doped oxide layer 608, and the undoped oxide layer 612 are referred to herein as sacrificial oxide layers because they can be removed by etching, and are mostly temporary layers that are removed before completion of the manufacturing process.

Figure 32:
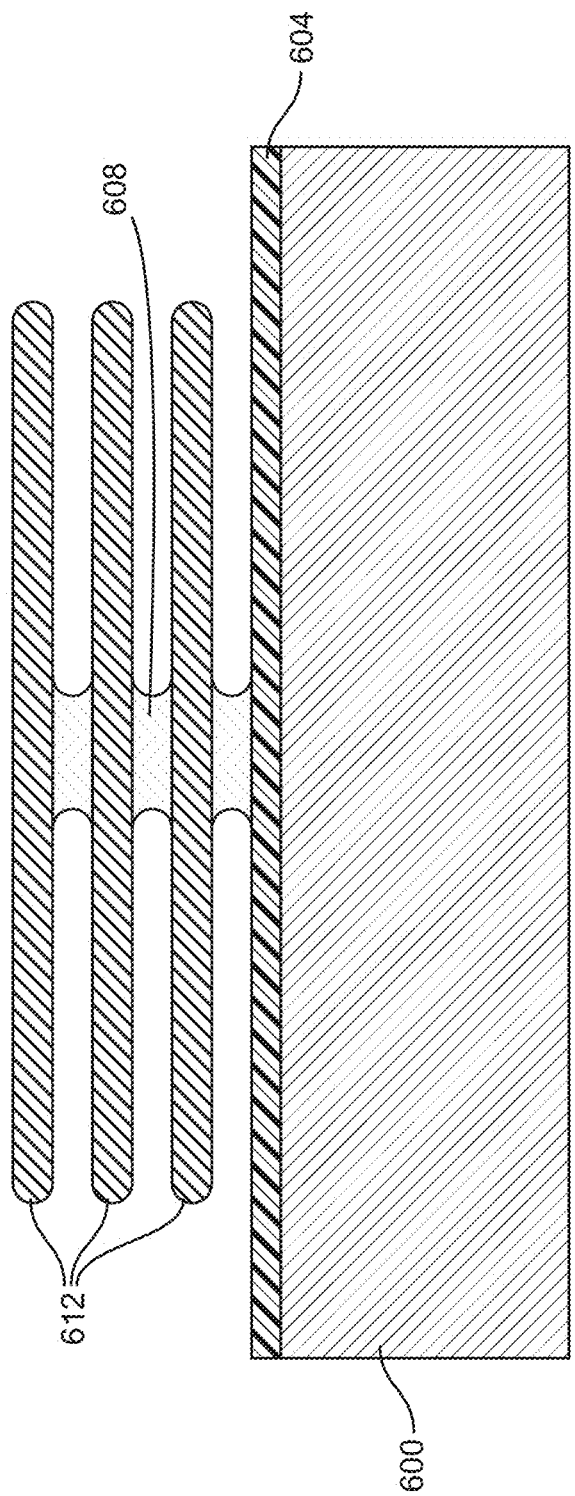
FIG. 32 illustrates another step of the method FIG. 30 according to some implementations of the disclosure.

At step 708, a sacrificial etch is completed by treating the sacrificial oxide layers 604, 608, 612 with hydrogen fluoride (HF) for a predefined time period to dissolve a portion of the sacrificial oxide layers 604, 608, 612. FIG. 32 illustrates the sacrificial oxide layers 604, 608, 612 after the sacrificial etch. During the sacrificial etch, the HF reacts most quickly with the doped oxide layer 608. As illustrated in FIG. 32, most of the doped oxide layer 608 has been removed by the HF, leaving a thin stem portion of doped oxide 608 proximate a center of the sacrificial oxide layers 604, 608, 612. In some embodiments, a radius of the stem is substantially the same as the radii of the through-holes in the bellow plates described above with respect to FIGS. 27-29. The sacrificial etch rounded the edges of the undoped oxide layers 612 and did not react with the thermal oxide layer 604.

Figure 33:
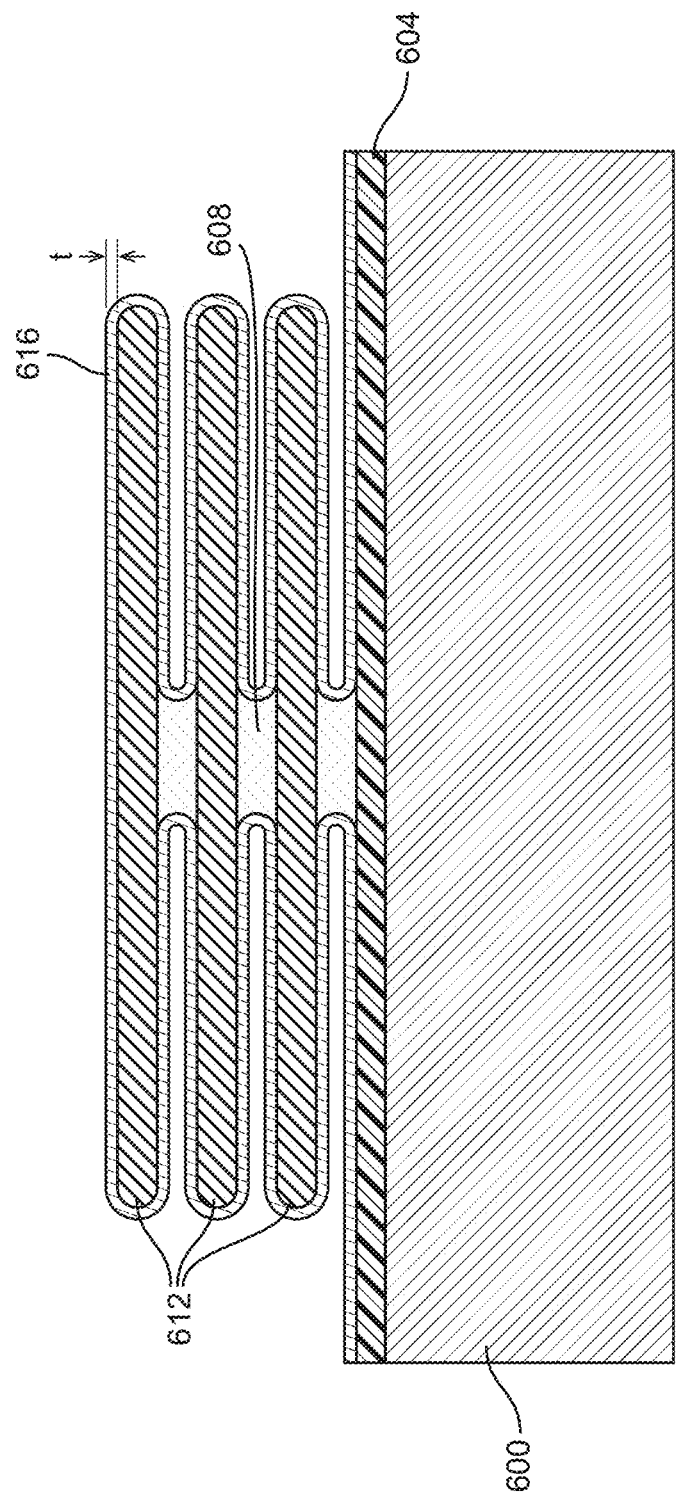
FIG. 33 illustrates another step of the method FIG. 30 according to some implementations of the disclosure.

At step 712, and as illustrated in FIG. 33, a diaphragm layer 616 of polysilicon or nitride is deposited over the sacrificial oxide layers 604, 608, 612. The diaphragm layer 616 is deposited using low pressure chemical vapor deposition (LPCVD) so that the polysilicon or silicon nitride material can coat all of the outer surfaces of the undoped oxide layer 612 and the doped oxide layer 608. The diaphragm layer 616 becomes the bellow diaphragm at the end of the manufacturing process and the sacrificial oxide layers 604, 608, 612 act as a scaffold layer for the diaphragm layer 616 so that the diaphragm 616 is formed in the shape defined by the sacrificial oxide layers 604, 608, 612 as the diaphragm layer 616 is deposited. Therefore, the thickness of the diaphragm layer 616 is the thickness of the bellow diaphragm. The diaphragm layer 616 can have a thickness t that is 0.1 µm through 2 µm. In the illustrated implementation, the thickness t is substantially 0.5 µm.

Figure 34:
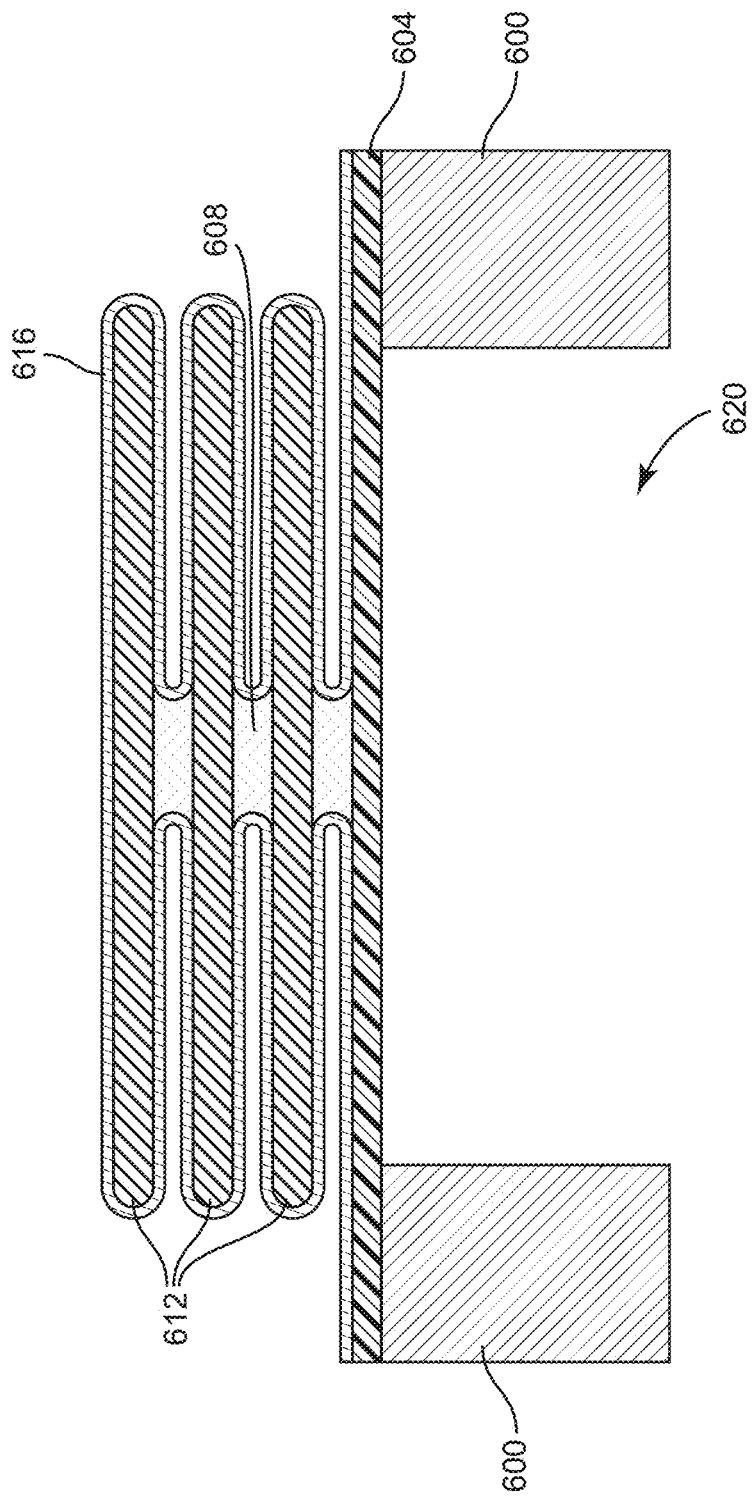
FIG. 34 illustrates another step of the method FIG. 30 according to some implementations of the disclosure.

At step 716, and as illustrated in FIG. 34, a portion of the MEMS substrate 600 is cut away to form a cavity 620 that extends to the thermal oxide layer 604. The portion of the MEMS substrate 600 can be removed using deep reactive-ion etching (DRIE).

Figure 35:
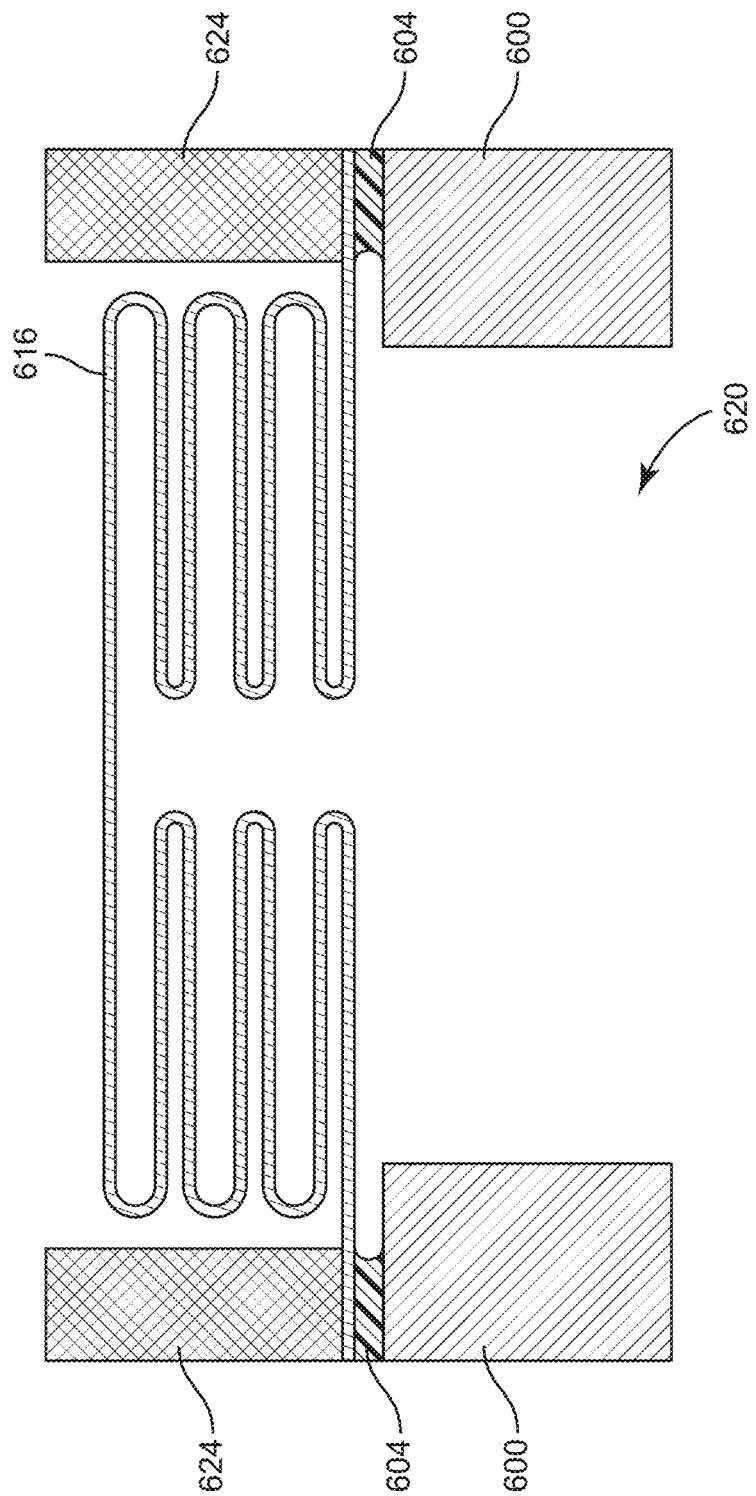
FIG. 35 illustrates another step of the method FIG. 30 according to some implementations of the disclosure.

At step 720, a second sacrificial etch is conducted to remove the sacrificial oxide layers 604, 608, 612. The second sacrificial etch may use higher concentration of HF and/or expose the sacrificial oxide layers 604, 608, 612 to the HF for a longer period of time and a higher volumetric content of HF than the sacrificial etch completed in step 608. As illustrated in FIG. 35, after completion of step 720, all of the doped oxide 608 layer and the undoped oxide layer 612 have been removed. A majority of the thermal oxide layer 604 has also been removed. The layer 616 is suspended over the cavity 620 after the sacrificial etch, and a perimeter of the layer 616 is secured to the MEMS substrate 600 by the remaining portion of the thermal oxide layer 604. Spacers 624 are secured to a portion of the diaphragm layer 616 that overlies the MEMS substrate 600 as illustrated in FIG. 35. When deployed in a microphone device such as the microphone device 82 illustrated in FIG. 3, the spacers 624 are sized to provide enough room for bellow diaphragm to deflect when the bellow diaphragm is deployed in the microphone device 82. The free ends of the spacers 624 are secured to the MEMS substrate 86 of the microphone device similar to what is shown in FIG. 3.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including by not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one recitation, even when the same claim includes the introductory phrases "one or more" or "at least one" and indefinite articles such as "a" or "an" (e.g. "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two functions," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g. "a system having at least one of" A, B, or C: would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., means plus or minus ten percent.

The foregoing description of illustrative elements has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A microphone comprising:
   a dielectric comb comprising:
   a housing defining a cavity;
      a plurality of conductors positioned within the cavity, the plurality of conductors structured to move in response to pressure changes while the housing remains fixed, the pressure changes including pressure changes resulting from acoustic activity and pressure changes resulting from changes in an atmospheric pressure, the plurality of conductors including:
- at least one first conductor configured to generate first electrical signals responsive to the pressure changes resulting from changes in the atmospheric pressure; and
- at least one second conductor configured to generate second electrical signals responsive to the pressure changes resulting from the acoustic activity; and at least one dielectric bar positioned within the cavity and secured in a fixed position with respect to the cavity such that the at least one dielectric bar remain fixed under the pressure changes, wherein each of the at least one dielectric bars is adjacent to at least the at least one first conductor or at least one second conductor of the plurality of conductors; and a control circuit comprising:
- an atmospheric pressure processing circuit electrically coupled to the at least one first conductor and configured to receive the first electrical signals and generate an atmospheric pressure signal indicative of the pressure changes resulting from the changes in atmospheric pressure; and
- an acoustic activity processing circuit electrically coupled to the at least one second conductor and configured to receive the second electrical signals and generate an acoustic signal indicative of the pressure changes resulting from the acoustic activity.

2. The microphone of claim 1, further comprising at least one isolator coupled to the housing and movable with respect to the housing in response to pressure changes, and wherein the plurality of conductors are coupled to the at least one isolator.

3. The microphone of claim 1, wherein the control circuit further comprises a charge pump electrically connected to at least a portion of the plurality of conductors to provide a biasing charge to at least the portion of the plurality of conductors, and wherein the atmospheric pressure processing circuit is configured to process the first electrical signals to generate a charge pump bias signal in response to the pressure changes resulting from the changes in the atmospheric pressure.

4. The microphone of claim 3, wherein the charge pump bias signal is configured to generate an electric force between the plurality of conductors to move the plurality of conductors in a direction opposite a direction of movement caused by the changes in the atmospheric pressure.

5. The microphone of claim 4, wherein the electric force is configured to return the plurality of conductors to a rest position at which the plurality of conductors would be positioned in the absence of the pressure changes resulting from the changes in atmospheric pressure.

6. The microphone of claim 1, further comprising a diaphragm that extends into the cavity and exerts a force on the dielectric comb, and wherein the pressure changes cause movement of the diaphragm, the changes in the movement of the diaphragm causing movement of the plurality of conductors relative to the plurality of dielectric bars.

7. The microphone of claim 1, wherein the cavity is a vacuum.

8. A control circuit for a microelectromechanical system (MEMS) microphone, the control circuit comprising:
- an atmospheric pressure processing circuit configured to receive a first signal from a first plurality of conductors of a movable sensing structure of the MEMS microphone generated in response to movement of the movable sensing structure and to process the first signal to generate a signal indicative of a change in an atmospheric pressure; and
- an acoustic activity processing circuit configured to receive a second signal from a second plurality of conductors of the movable sensing structure, the acoustic activity processing circuit configured to process the second signal to generate a signal indicative of acoustic activity.

9. The control circuit of claim 8, further comprising a charge pump connected to the movable sensing structure, wherein the atmospheric pressure processing circuit is configured to control the charge pump to provide a bias signal to one or more of at least the first plurality of conductors of the movable sensing structure based on the signal indicative of the change in the atmospheric pressure.

10. The control circuit of claim 9, wherein the bias charge is sized to bias the movable sensing structure to compensate for the change in the atmospheric pressure.

11. The control circuit of claim 8, wherein the second signal has a high frequency portion and a low frequency portion, and wherein the acoustic activity processing circuit includes a filter configured to remove the low frequency portion of the second signal.

12. The control circuit of claim 8, wherein the second signal has an amplitude, and wherein the acoustic activity processing circuit includes a feedback circuit configured to determine the amplitude of the second signal and, in response to the amplitude exceeding a predetermined threshold, generate a feedback signal to reduce the amplitude of the second signal to prevent overload of the acoustic activity processing circuit.

13. The control circuit of claim 8, wherein the second plurality of conductors is different from the first plurality of conductors.

14. The microphone of claim 1, wherein the housing includes a first sidewall, a second sidewall, and a bottom wall coupled to the first sidewall and the second sidewall, wherein the at least one dielectric bar is spaced from the first sidewall and the first conductor is disposed between the at least one dielectric bar and the first sidewall.

15. The microphone of claim 1, wherein the at least one first conductor is one of a plurality of first conductors that are electrically coupled to the atmospheric pressure processing circuit, and the at least one second conductor is one of a plurality of second conductors that are electrically coupled to the acoustic activity processing circuit.

* * * * *